(12) United States Patent
Takemura et al.

(10) Patent No.: US 8,175,731 B2
(45) Date of Patent: May 8, 2012

(54) APPARATUS FOR EDITING CONFIGURATION DATA OF DIGITAL MIXER

(75) Inventors: Satoshi Takemura, Hamamatsu (JP); Makoto Hiroi, Hamamatsu (JP); Akihiro Miwa, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 199 days.

(21) Appl. No.: 12/541,812

(22) Filed: Aug. 14, 2009

(65) Prior Publication Data

US 2009/0310800 A1 Dec. 17, 2009

Related U.S. Application Data

(62) Division of application No. 11/067,433, filed on Feb. 25, 2005, now Pat. No. 7,738,980.

(30) Foreign Application Priority Data

Mar. 4, 2004 (JP) ................................ 2004-060099
Mar. 4, 2004 (JP) ................................ 2004-060100
Mar. 4, 2004 (JP) ................................ 2004-060101

(51) Int. Cl.
*G06F 17/00* (2006.01)

(52) U.S. Cl. ........................................ 700/94; 381/119

(58) Field of Classification Search ................ 700/94
See application file for complete search history.

(56) References Cited

U.S. PATENT DOCUMENTS

| 5,192,825 | A | 3/1993 | Kunimoto |
| 5,386,568 | A | 1/1995 | Wold et al. |
| 5,812,688 | A | 9/1998 | Gibson |
| 5,862,231 | A | 1/1999 | Tokuhisa et al. |
| 6,057,829 | A | 5/2000 | Silfvast |
| H001882 | H | 10/2000 | Asthana et al. |
| 6,327,631 | B1 | 12/2001 | Eastty et al. |
| 6,389,541 | B1 | 5/2002 | Patterson |
| 6,421,692 | B1 | 7/2002 | Milne et al. |
| 6,738,964 | B1 | 5/2004 | Zink et al. |
| 6,965,800 | B2 * | 11/2005 | Schmit et al. .................. 700/29 |
| 7,164,435 | B2 | 1/2007 | Wang et al. |
| 7,165,005 | B2 | 1/2007 | Steger et al. |
| 7,392,103 | B2 | 6/2008 | Takahashi |
| 7,433,745 | B2 | 10/2008 | Aoki et al. |

(Continued)

FOREIGN PATENT DOCUMENTS

| JP | 62-072049 A | 4/1987 |
| JP | 64-066768 A | 3/1989 |
| JP | 04-302344 A | 10/1992 |
| JP | 7334358 | 12/1995 |
| JP | 11-298514 A | 10/1999 |
| JP | 2000-020377 A | 1/2000 |
| JP | 2002-278754 | 9/2002 |

OTHER PUBLICATIONS

Owner's Manual for Digital Mixing Engine DME 32 by Yamaha Corporation, 2001.

(Continued)

*Primary Examiner* — Curtis Kuntz
*Assistant Examiner* — Paul McCord
(74) *Attorney, Agent, or Firm* — Morrison & Foerster LLP

(57) ABSTRACT

A digital mixer has a custom component specified by a configuration ID. Further, the same configuration ID is provided to another custom component for ensuring compatibility of scene data which is used for operating the custom component. When a custom component of the mixer configuration is edited, the edited custom component is provided with the same configuration ID as the initial custom component before the editing. Scene data of the initial custom component can be copied to scene data of the edited custom component or vice versa provided that their configuration IDs match with each other.

6 Claims, 16 Drawing Sheets

U.S. PATENT DOCUMENTS

| | | | |
|---|---|---|---|
| 7,489,978 | B2 | 2/2009 | Suyama et al. |
| 7,552,389 | B2 | 6/2009 | Drewes et al. |
| 7,738,980 | B2 | 6/2010 | Takemura et al. |
| 7,810,164 | B2 | 10/2010 | Hiroi et al. |
| 2001/0030647 | A1* | 10/2001 | Sowizral et al. ............. 345/420 |
| 2002/0038308 | A1 | 3/2002 | Cappi |
| 2002/0082732 | A1 | 6/2002 | Suyama et al. |
| 2002/0107592 | A1 | 8/2002 | Craig |
| 2003/0093245 | A1* | 5/2003 | Schmit ......................... 702/186 |
| 2003/0177073 | A1* | 9/2003 | Ogai .............................. 705/26 |
| 2003/0212466 | A1 | 11/2003 | Alferness |
| 2004/0133291 | A1 | 7/2004 | Nakayama et al. |
| 2005/0060438 | A1 | 3/2005 | Drewes et al. |
| 2005/0195678 | A1 | 9/2005 | Takemura et al. |
| 2005/0254780 | A1 | 11/2005 | Takemura et al. |
| 2006/0037001 | A1 | 2/2006 | Irie et al. |
| 2006/0101525 | A1 | 5/2006 | Hiroi et al. |
| 2006/0143570 | A1 | 6/2006 | Washington et al. |
| 2008/0285757 | A1 | 11/2008 | Bradley et al. |
| 2008/0298591 | A1 | 12/2008 | Bradley et al. |

OTHER PUBLICATIONS

Digital Production Console, DM2000 Manual, pp. 139-147, 2002.
Creating QuickReport Component, Sep. 2002.
Japanese Office Action mailed Apr. 7, 2008 regarding JP-2004-06099.
Japanese Office Action mailed Apr. 7, 2008 regarding JP-2004-06100.
Japanese Office Action mailed Apr. 7, 2008 regarding JP-2004-06101.
Notice of Grounds for Rejection mailed May 14, 2009, for JP Application No. 2004-328296, with English translation, six pages.
Notice of Grounds for Rejection mailed May 14, 2009, for JP Application No. 2004-328297, with English translation, six pages.
Yamaha (May 1, 2000). Digital Mixing Engine (DME 32) Owner's Manual, English version, 296 pages.
Yamaha (May 1, 2000). Digital Mixing Engine (DME 32) Owner's Manual, Japanese language version, 299 pages.
Yamaha. DME32 Version 1.1 Owner's Manual Supplement, with English translation, four pages.
Yamaha. DME32 Version 1.5 Digital Mixing Engine Owner's Manual Supplement, 16 pages.
DME 32 Version 1.5 Digital Mixing Engine Owner's Manual Supplement, (Aug. 2002). Yamaha Corporation, Japan, 16 pages.
DME32 V1.1 Owner's Manual Supplement, (Aug. 2002). Yamaha Corporation, Pro Audio & Digital Musical Instrument Division, Japan, with English Translation, four pages.
Polycom. (2001). Polycom Conference Composer User Guide, Polycom, Inc. 29 pages.
Yamaha. (Aug. 2002). Digital Mixing Engine (DME 32) Owner's Manual, English version, 296 pages.
Yamaha. (Aug. 2002). Digital Mixing Engine (DME 32) Owner's Manual, Japanese language version, 299 pages.

* cited by examiner

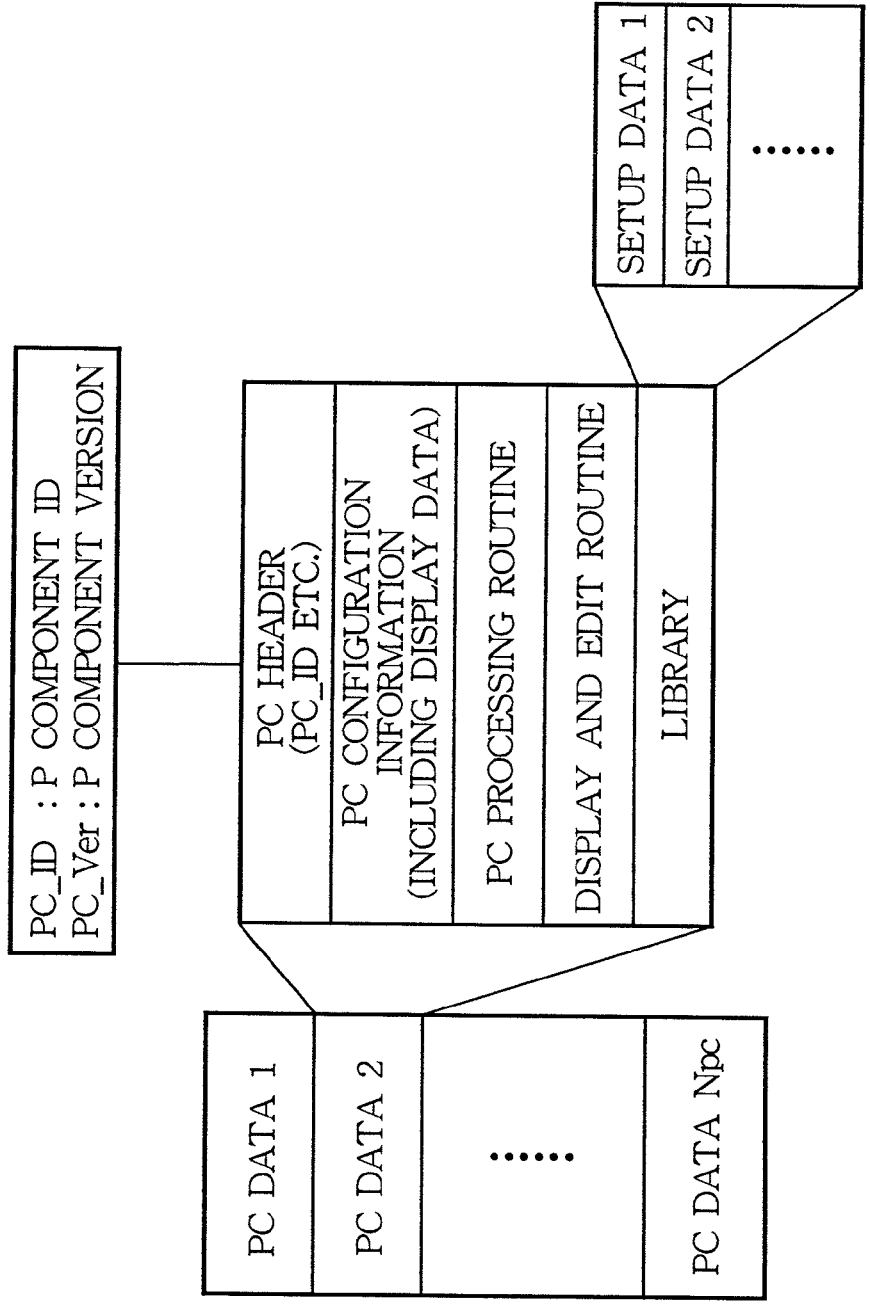

CUSTOM COMPONENT DATA

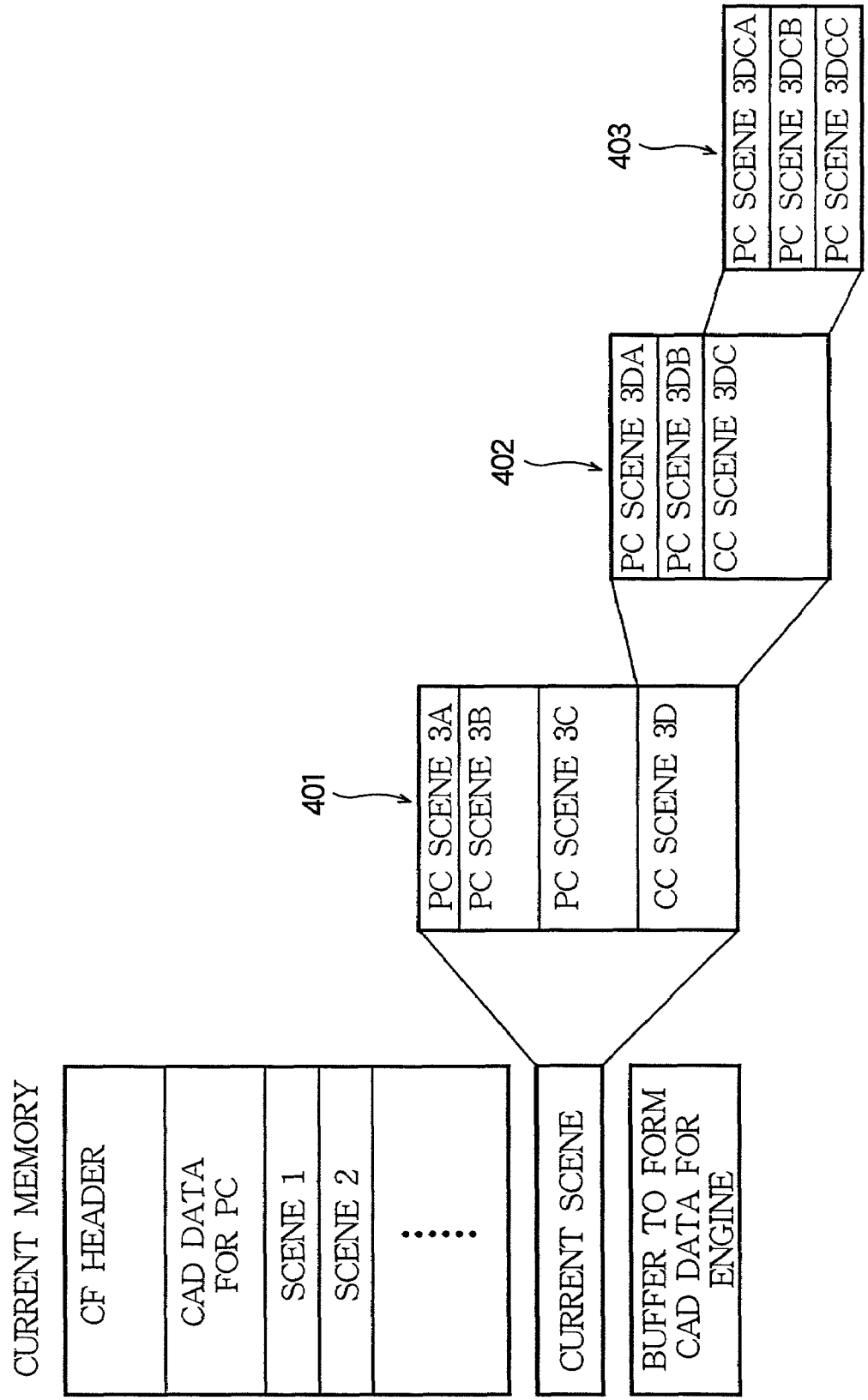

FIG.6 (a)
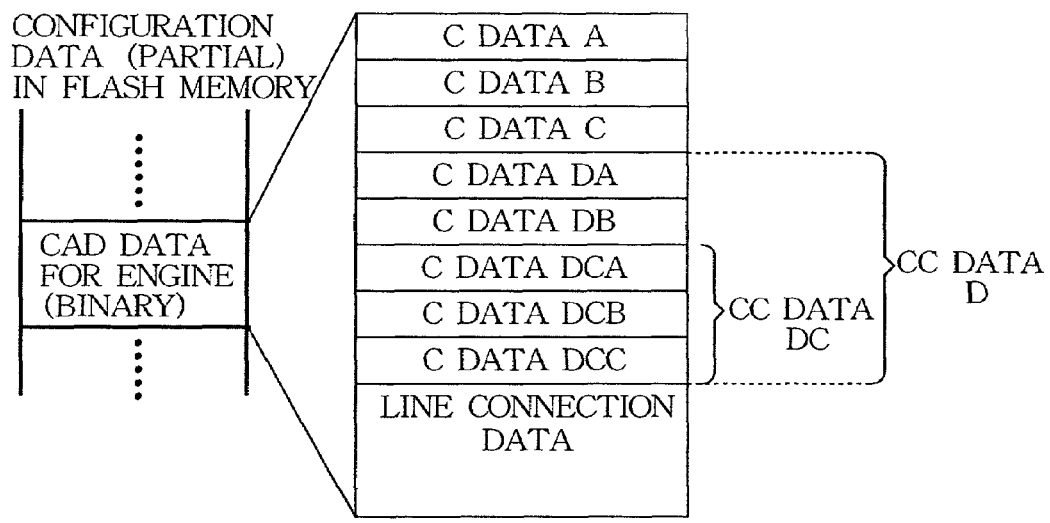
FIG.6 (b)
CONFIGURATION DATA IN THE RAM
CURRENT MEMORY
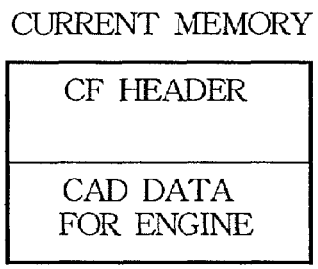
FIG.6 (c)
COMPONENT DATA (PARTIAL) IN THE FLASH MEMORY
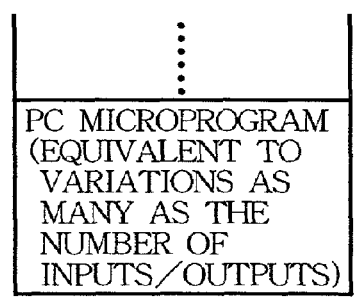
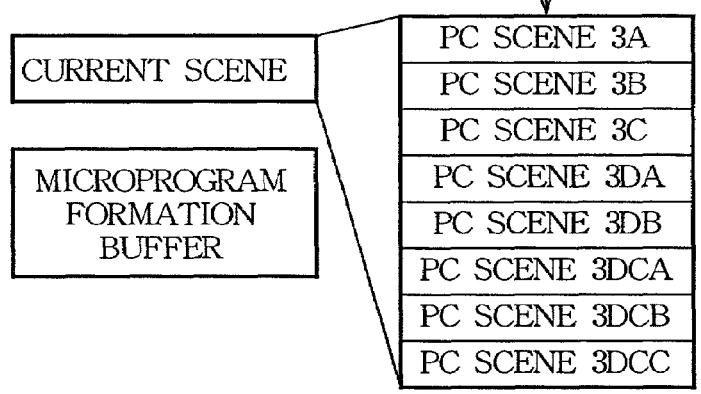

FIG.8(a) SINGLE VALUE
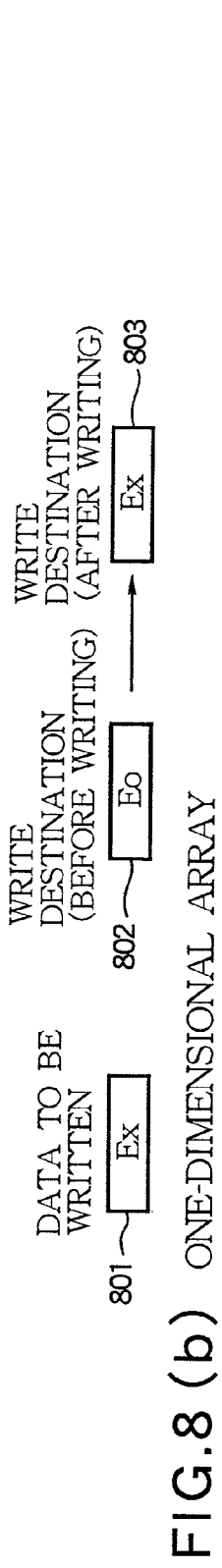
FIG.8(b) ONE-DIMENSIONAL ARRAY
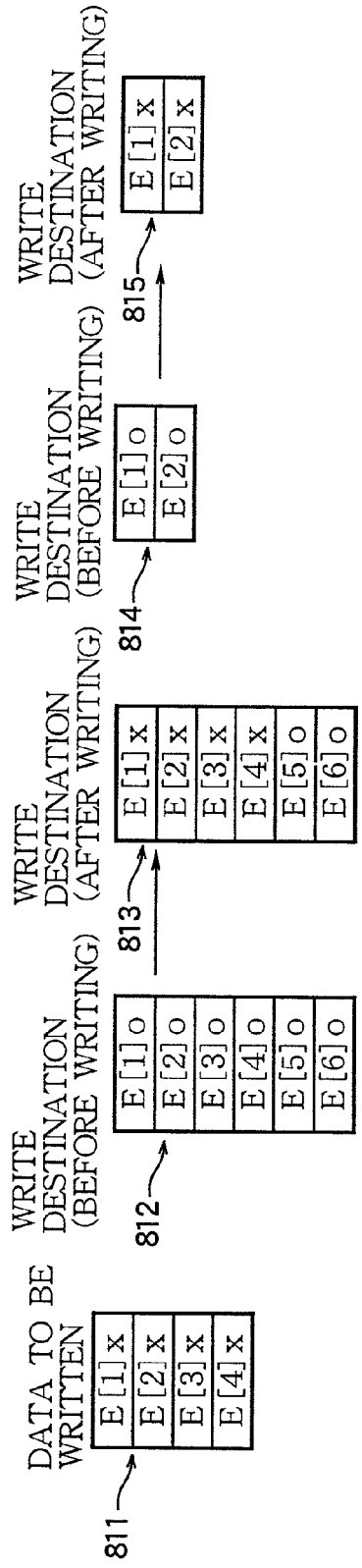
FIG.8(c) TWO-DIMENSIONAL ARRAY
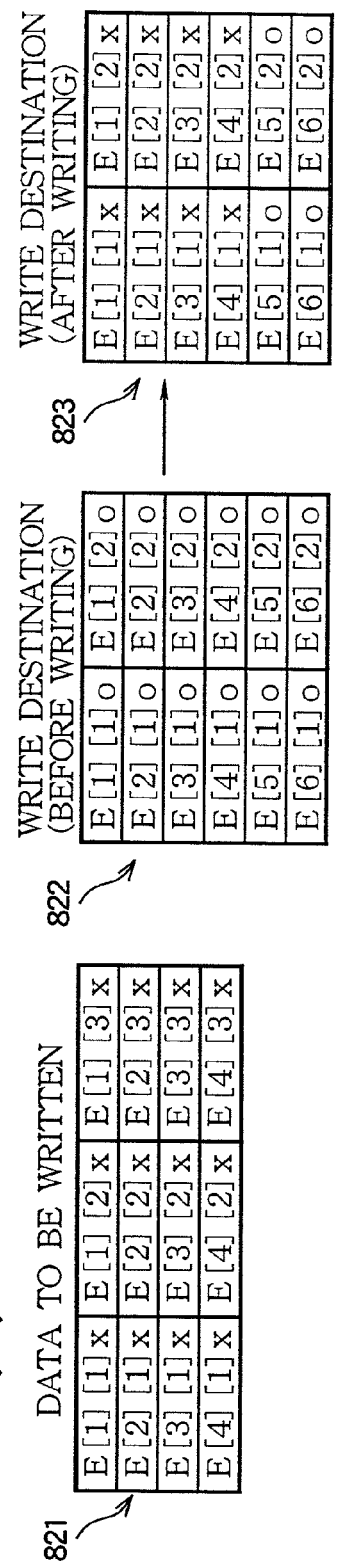

PREPARATORY PROCESS OF THE MIXER CONTROL PROGRAM FOR CURRENT MEMORY AND SCENE MEMORY

PREPARATORY PROCESS OF THE ENGINE FOR CURRENT MEMORY AND SCENE MEMORY

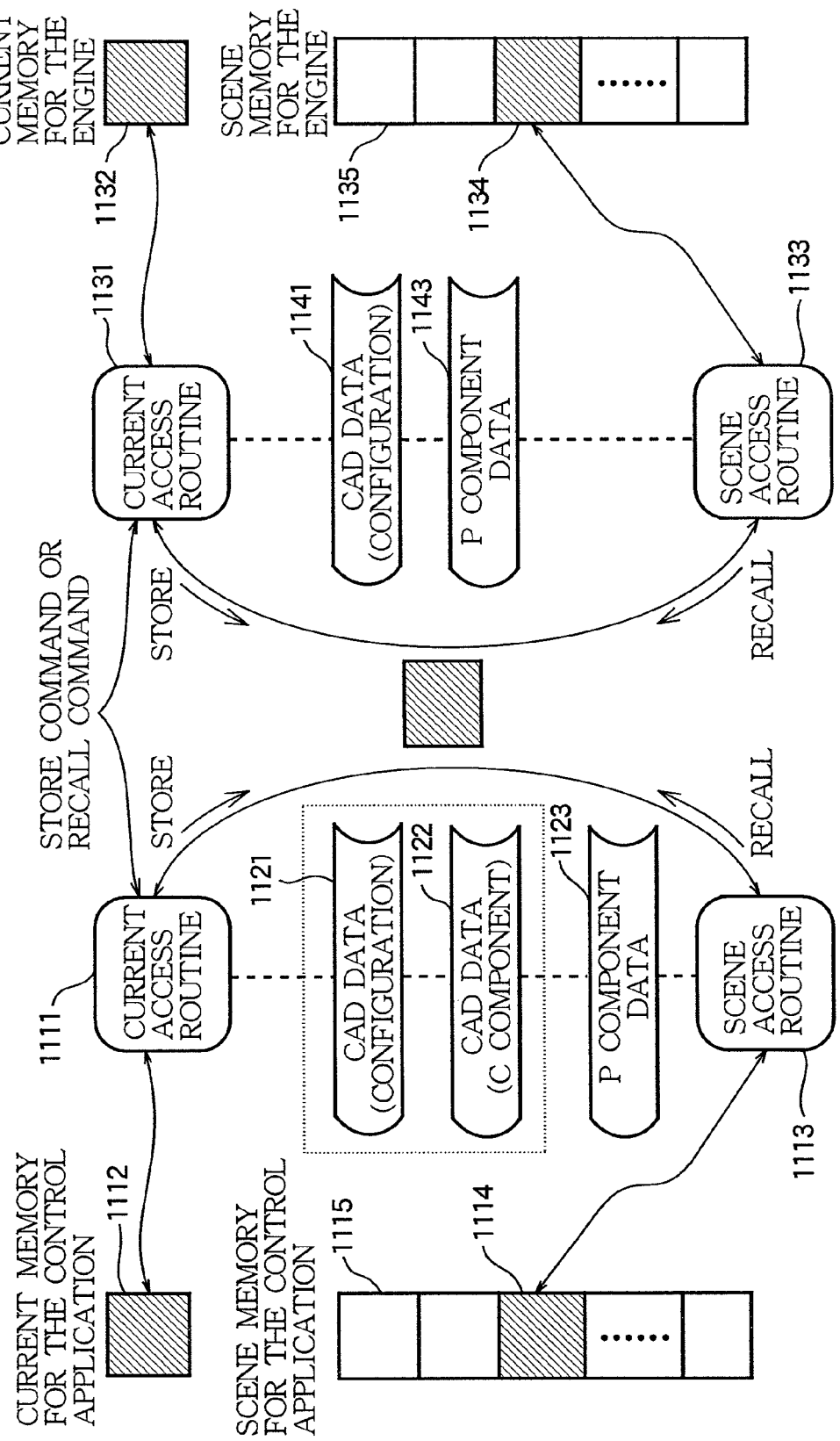

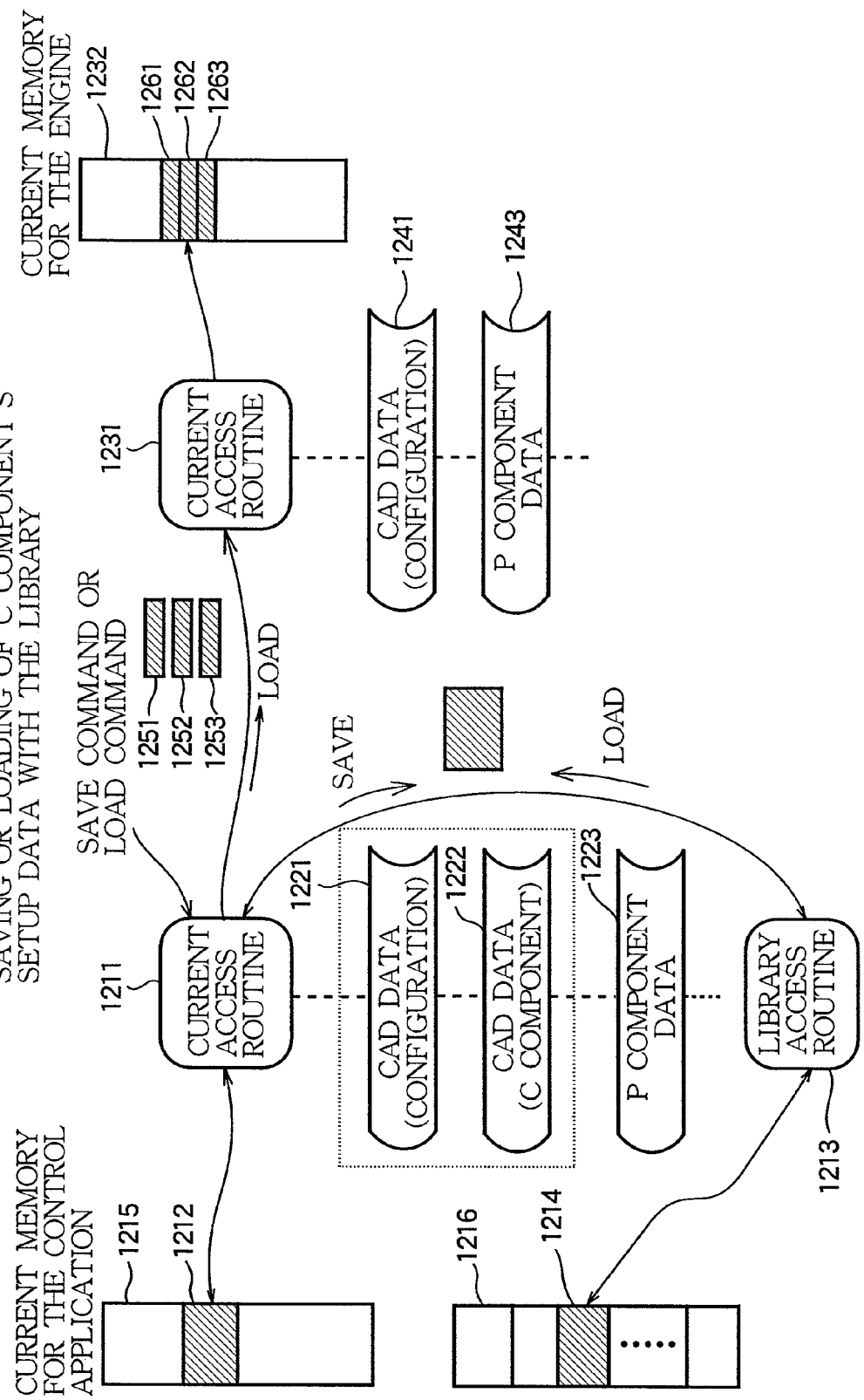

APPARATUS FOR EDITING CONFIGURATION DATA OF DIGITAL MIXER

CROSS-REFERENCE TO RELATED APPLICATIONS

This application is a division of U.S. patent application Ser. No. 11/067,433, filed Feb. 25, 2005, the entire disclosure of which is incorporated herein by reference.

BACKGROUND OF THE INVENTION

1. Technical Field

The present invention relates to a scene data editing apparatus, a mixer configuration editing apparatus, a custom component editing apparatus, and a scene data storage apparatus for use in processing of sound signals in a digital mixer.

2. Related Art

Conventionally, as described in DIGITAL MIXING ENGINE DME32 Instruction Manual, YAMAHA CORPORATION, 2001, there is known a digital mixer whose mixer configuration is customizable. Such digital mixer constitutes a sound signal processing unit using a processor (e.g., digital signal processor, DSP) that can operate on programs. The digital mixer can process sound signals based on a mixer configuration edited by using an external PC (personal computer). Special application software is used to create or edit the mixer configuration on the PC. That is, creating and editing of the mixer configuration requires arranging components as parts for signal processing on a PC screen and making wire connection between the arranged components to define the input/output relationship. When the created mixer configuration is transferred to the digital mixer for execution, the digital mixer realizes operations of the mixer configuration by executing programs corresponding to the created mixer configuration.

The above-mentioned components include a preset component (hereafter referred to as a P component) and a custom component (hereafter referred to as a C component). The P component is used as a basic unit of components constituting the mixer configuration. The C component is a combination of P components or subcomponents and can be treated as one component. A user granted a specified authentication can freely create and edit C components.

In a first aspect of the prior art, such a digital mixer can use a plurality of pieces of scene data for each mixer configuration. The scene data is a data set of parameters used for operation of the mixer configuration. The same mixer configuration may need to operate based on various parameter values depending on scenes. For this purpose, there is provided a plurality of scene data that are appropriately called to operate the digital mixer. The scene data is a collection of component scenes corresponding to the components that constitute the mixer configuration.

In a second aspect of the prior art, such a digital mixer requires various parameter settings for each component of the mixer configuration. A library may be provided for P components to make the parameter setup easy. When P components are used as constituent elements of the mixer configuration, parameters needs to be set for the P components at a time. For this purpose, the library comprises a plurality of parameter sets for the P components. A user can follow specified operations to read setup data from a P component library for P components as constituent elements of the mixer configuration and set parameters for the P components at a time.

In a third aspect of the prior art, the above-mentioned C component can be created and edited by using a P component as a constituent element, namely as a subcomponent.

As mentioned above, in the first aspect of the prior art, the C component itself comprises several P components as subcomponents. Generally, different C components have differently structured constituent elements. Accordingly, different C components have corresponding component scenes that are incompatible with each other. This incompatibility causes inconveniences in various situations. Since the user can freely customize C components, for example, one C component can be slightly edited to create another C component. In this case, the edited C component makes it impossible to use a C component scene used in the initial C component before the editing.

With regard to the second aspect of the prior art, however, it has been impossible to use a library for the above-mentioned C components. Accordingly, parameters cannot be set for C components at a time. On the other hand, it has been impossible to save a user-specified parameter setting for the C components.

With regard to the third aspect of the prior art, the C component is created and edited by using a P component as a constituent element. However, it has been impossible to use a C component as a constituent element of another C component.

SUMMARY OF THE INVENTION

It is a first object of the present invention to configure a sound signal processing unit using a processor capable of operating according to programs and to provide parameter compatibility for user-customizable C components under specified conditions in a digital mixer which processes sound signals based on a mixer configuration edited by using an external PC.

It is a second object of the present invention to configure a sound signal processing unit of a digital mixer by using a processor capable of operating according to programs, to provide user-customizable C components with a library for setting parameters at a time, and to flexibly interchange setup data in a library of a digital mixer which processes sound signals based on a mixer configuration edited by using an external PC.

It is a third object of the present invention to configure a sound signal processing unit of the digital mixer by using a processor capable of operating according to programs and enable to use existing C components as constituent elements of a new C component in a C component creation and editing apparatus of the digital mixer which processes sound signals based on mixer configuration edited by using an external PC.

In a first aspect of the invention, an inventive apparatus is designed for editing scene data of a digital mixer which configures a sound signal processing unit by using a processor capable of executing a program and which operates the sound signal processing unit composed of various components including a custom component specified by component identification information and version information, the apparatus editing custom component scene data which is a data set of parameters for use in operation of a custom component of the sound signal processing unit. The inventive apparatus comprises a first storage section that stores first custom component scene data which is a data set of parameters for use in operation of a first custom component specified by first component identification information and first version information, an editing section that edits contents of the first custom component scene data stored in the first storage section, a second storage section that stores second custom component scene data which is a data set of parameters for use in operation of a second custom component specified by second component identification information and second version information, and a copy section that is operated when the first component identification information and the second component identification information match with each other even though the first version information and the second version information are different, for reading the second custom component scene data from the second storage section and writing at least a common part of the read second custom component scene data into the first storage section, where the common part corresponds to a common portion of the first custom component and the second custom component.

Preferably, the first custom component specified by the first component identification information and the first version contains subcomponents each specified by unique identification code and the second custom component specified by the second component identification information and the second version contains subcomponents each specified by unique identification code, and wherein the copy section uses the unique identification code to determine the common portion of the first custom component and the second custom component in terms of the subcomponents having the same unique identification codes.

Further, an inventive apparatus is designed for editing configuration data of a digital mixer which configures a sound signal processing unit by using a processor capable of executing a program corresponding to the configuration data and which operates the sound signal processing unit composed of various components including a custom component specified by component identification information and version information, the apparatus editing custom component configuration data which is used for configuring a custom component of the sound signal processing unit. The inventive apparatus comprises a custom component configuration data storage section that stores custom component configuration data of custom components, an editing section that reads the custom component configuration data of the custom component specified by the component identification information and the version information from the custom component configuration data storage section, then edits the read custom component configuration data, and writes the edited custom component configuration data to the custom component configuration data storage section with the same component identification information and updated version information, and a transfer section that manipulates the custom component configuration data as required and transfers the manipulated custom component configuration data to the digital mixer. The editing section includes an adding subsection that is operated as directed by a user to add a new subcomponent to the custom component and allocate a unique identification code to the new subcomponent such that the unique identification code adheres to the added new subcomponent even after the version information is updated due to the editing of the custom component configuration data, a deleting subsection that is operated as directed by the user for deleting an existing subcomponent from the custom component, and a connecting subsection that is operated as directed by the user for setting connections among subcomponents included in the custom component.

Preferably, the adding subsection allocates the new unique identification code to the new subcomponent, such that the new unique identification code is selected from codes which have never been used in the custom component specified by the same component identification information, and the deleting subsection abolishes the unique identification code allocated to the deleted existing subcomponent such that the abolished unique identification code is never used for a new subcomponent in the custom component specified by the same component identification information. Further, the editing section includes a changing subsection that is operated as directed by the user for changing at least one of the subcomponents included in the custom component to a subcomponent of the same type but a different scale as said one of the subcomponents while maintaining the unique identification code allocated to said one of the subcomponents.

Still further, an inventive scene data editing apparatus is provided for use with a digital mixer having a processor capable of executing a program to constitute a sound signal processing unit having a custom component specified by component identification information and version information, the apparatus being provided for editing custom component scene data which is a parameter set for use in operation of the custom component of the sound signal processing unit. The inventive scene data editing apparatus comprises a component configuration data storage section that stores a plurality of custom component configuration data including first custom component configuration data defining a first custom component specified by first component identification information and first version information, and second custom component configuration data defining a second custom component specified by second component identification information and second version information, a first custom component scene data storage section that stores first custom component scene data which is a parameter set of the first custom component specified by the first component identification information and the first version information for use in operation of the first custom component, a first access section that specifies an arrangement of data elements of each parameter of the first custom component scene data based on the first custom component configuration data and that is operated to access the first custom component scene data storage section for reading and writing of the first custom component scene data, a parameter editing section that reads the first custom component scene data stored in the first custom component scene data storage section by use of the first access section for editing contents of the first custom component scene data, a second custom component scene data storage section that stores second custom component scene data which is a parameter set for use in the second custom component specified by the second component identification information and the second version information, a second access section that specifies an arrangement of data elements of each parameter of the second custom component scene data based on the second custom component configuration data and that is operated to access the second custom component scene data storage section for reading and writing of the second custom component scene data, and a copy section that performs copying of each parameter between the first custom component scene data stored in the first custom component scene data storage section and the second custom component scene data stored in the second custom component scene data storage section by use of the first access section and the second access section if a match is found between the first component identification information and the second component identification information, such that the copying is effected only a portion of the data elements overlapped between the first custom component scene data and the second custom component scene data.

In a second aspect of the invention, a parameter setup apparatus is provided for use with a digital mixer which configures a sound signal processing unit having a mixer configuration by using a processor capable of executing a program corresponding to the mixer configuration and which operates the sound signal processing unit by using parameters. The inventive apparatus comprises an editing section that creates a custom component of the mixer configuration and edits the created custom component, a saving section that saves the created and edited custom component, and a library storage section that sores a plurality of setup data which can be selectably read from the library storage section for setting the parameters to the custom component at a time the saved custom component is called for operation.

Further, an inventive parameter setup apparatus is provided for use with a digital mixer which configures a sound signal processing unit by using a processor capable of executing a program, the sound signal processing unit being composed of components including a custom component specified by component identification information, the apparatus setting up a parameter set for use in operation of the custom component of the sound signal processing unit. The inventive apparatus comprises a library storage section that can store a plurality of setup data each capable of setting up a parameter set for use in operation of a corresponding custom component, a scene storage section that stores scene data which represents data of a parameter set for use in operation of the custom component to be operated by the digital mixer, an editing section that edits contents of the scene data stored in the scene storage section, a save section that reads the scene data stored in the scene storage section and writes the read scene data into the library storage section as one of the setup data such that said one of the setup data is identified by the same component identification information as that of the custom component operated by using the scene data, and a load section that reads one of the setup data stored in the library storage section and writes the scene data stored in the scene storage section by said one of the setup data on condition that there is a match between the component identification information of the custom component corresponding to the scene data on the scene storage section and component identification information allocated to said one of the setup data read from the library storage section.

Preferably, the save section and the load section write at least a part of the scene data or the scene data which corresponds to a portion common to both of the custom components between which the scene data or the scene data is copied. The inventive parameter setup apparatus may further comprises an access section that prepares an access routine to setup data of one custom component which is stored in the library storage section and which has a data arrangement corresponding to configuration of said one custom component, and another access section that prepares another access routine to scene data of another custom component which is stored in the scene storage section and which has another data arrangement corresponding to configuration of said another custom component, wherein said one access routine and said another access routine are used to interchange the setup data and scene data through the save section and the load section. The inventive parameter setup apparatus may further comprises a transmitting section that transmits the scene data of the custom component stored in the scene storage section to the digital mixer as setup data of the custom component.

Still further, an inventive parameter setup apparatus is provided for use with a digital mixer which configures a sound signal processing unit having a mixer configuration composed of custom components by using a processor capable of executing a program corresponding to the mixer configuration and which operates the respective custom components of the sound signal processing unit by using respective parameter sets, each custom component being identified by component identification information. The inventive the apparatus comprises a library storage section that sores a plurality of setup data which can be used to set up a plurality of parameter sets in correspondence to a plurality of custom components including a first custom component identified by first component identification information and a second custom component identified by second component identification information, and a copy section that copies setup data of the first custom component stored in the library storage section as setup data of the second custom component having a configuration different from the first custom component on condition that the first and second custom components have the same component identification information.

Preferably, the copy section copies at least a part of the setup data which corresponds to a portion common to both of the first custom component and the second custom component.

In a third aspect of the invention, a custom component creating and editing apparatus is provided for use with a digital mixer which configures a sound signal processing unit having a given mixer configuration composed of a custom component by using a processor capable of executing a program corresponding to the mixer configuration. The inventive apparatus is provided for creating and editing the custom component, and comprises a preset component data storage section that stores preset component data defining preset components which may be used as a component of custom components, a custom component data storage section that stores custom component data defining custom components each composed of one or more preset components, a custom component creating and editing section that reads either of the preset component data and the custom component data for creating a new custom component composed of either one or more of the preset components and one or more of the custom components and for editing the new custom component, and an expansion section that is operated when the new custom component is used by the digital mixer for breaking down the new custom component into one or more of the custom components each of which is further broken down into one or more of the preset components such that custom component data of the new custom component is expanded to represent an ultimate group of preset components.

Preferably, the expansion section performs expansion of the custom component data during a compilation process which converts the custom component data into a form interpretable and executable by the processor of the digital mixer, and the expansion section transmits the converted form of the custom component data to the digital mixer. The expansion section may perform expansion of the custom component data when the digital mixer selects a mixer configuration which includes one or more of the custom component. The inventive custom component creating and editing apparatus may further comprises an access section that prepares an access routine to access scene data based on a configuration of the custom component, the scene data being a parameter set for use in operation of the custom component and having a data arrangement specified by the configuration of the custom component.

To achieve the first object of the invention, the first aspect of the present invention provides each C component with component identification information (configuration ID). Further, the same configuration ID is provided to C components that ensure compatibility between C component scene data. When a C component in the mixer configuration is edited, for example, the edited C component is provided with the same configuration ID as the C component before the edit.

C component scene data is read from the storage as a read origin and is written to a write destination on condition of a match between configuration IDs of C components in the read origin and the read destination. Moreover, unique identification code (unique ID) is provided to each subcomponent constituting a C component. When provided with the same configuration ID, C components, though differently configured, can interchange their C component scene data with each other based on unique IDs. The mixer configuration may be available as a file or may be expanded in RAM.

The first aspect of the present invention ensures compatibility of C component scene data between different C components when configuration IDs match. It is possible to interchange (recall, store, or copy) C component scene data. Accordingly, when the C component configuration is edited, a C component scene created for the C component before the edit can be used for a new C component. On the other hand, a C component scene created for the new C component can be used for the C component before the edit.

To achieve the second object of the invention, the second aspect of the present invention provides a library for each C component. The present invention provides each C component with component identification information (configuration ID). The same configuration ID is provided to C components that ensure compatibility between setup data in a library for C components. When a C component in the mixer configuration is edited, for example, the edited C component is provided with the same configuration ID as the C component before the edit. Setup data of a C component is read from the library as a read origin and is written to a write destination on condition of a match between configuration IDs of C components in the read origin and the read destination.

Since the second aspect of the present invention provides a library for C components, parameters can be easily set for C components at a time. A user can save parameter setting for C components as the setup data to the library. When the component identification matches between different C components, compatibility is ensured between the setup data of the C components stored in the library. The setup data can be interchanged (loaded, saved, or copied). When the C component configuration is edited, the library setup data created for the C component before editing can be used for new C component. On the other hand, the library setup data created for the new C component can be used for the C component before editing.

To achieve the third object of the invention, the third aspect of the present invention enables C components to be nested. A C component may use other C components as constituent elements that is subcomponents. In such case, the C component is expanded even though it is nested several layers deep so as to break down the C component to the lowest-layer of P components, that is, ultimate subcomponents. The C component is finally expanded to P components. This expansion needs to be performed during compilation of mixer configuration data. Scene data associated with the C component has a data structure corresponding to the configuration of the C component. To access the scene data, there is provided a scene access routine corresponding to the C component configuration, making access to the scene data easy.

The third aspect of the present invention can nest C component several layers deep. It is possible to improve applicability of C components and facilitate creation and editing of C components according to various specifications. Further, the scene access routine is provided to comply with the C component configuration, facilitating access to scene data corresponding to C components.

BRIEF DESCRIPTION OF THE DRAWINGS

FIGS. 6(a), 6(b) and 6(c) are configuration diagrams of CF data (partial) and the like provided on the engine.

FIGS. 8(a), 8(b) and 8(c) are diagrams exemplifying a process to write element scenes.

FIG. 11 is a schematic diagram showing how to store or recall the scene memory.

FIG. 12 is a schematic diagram showing how to save or load C component setup data from the library.

DETAILED DESCRIPTION OF THE INVENTION

Embodiments of the present invention will be described in further detail with reference to the accompanying drawings.

Figure 1:
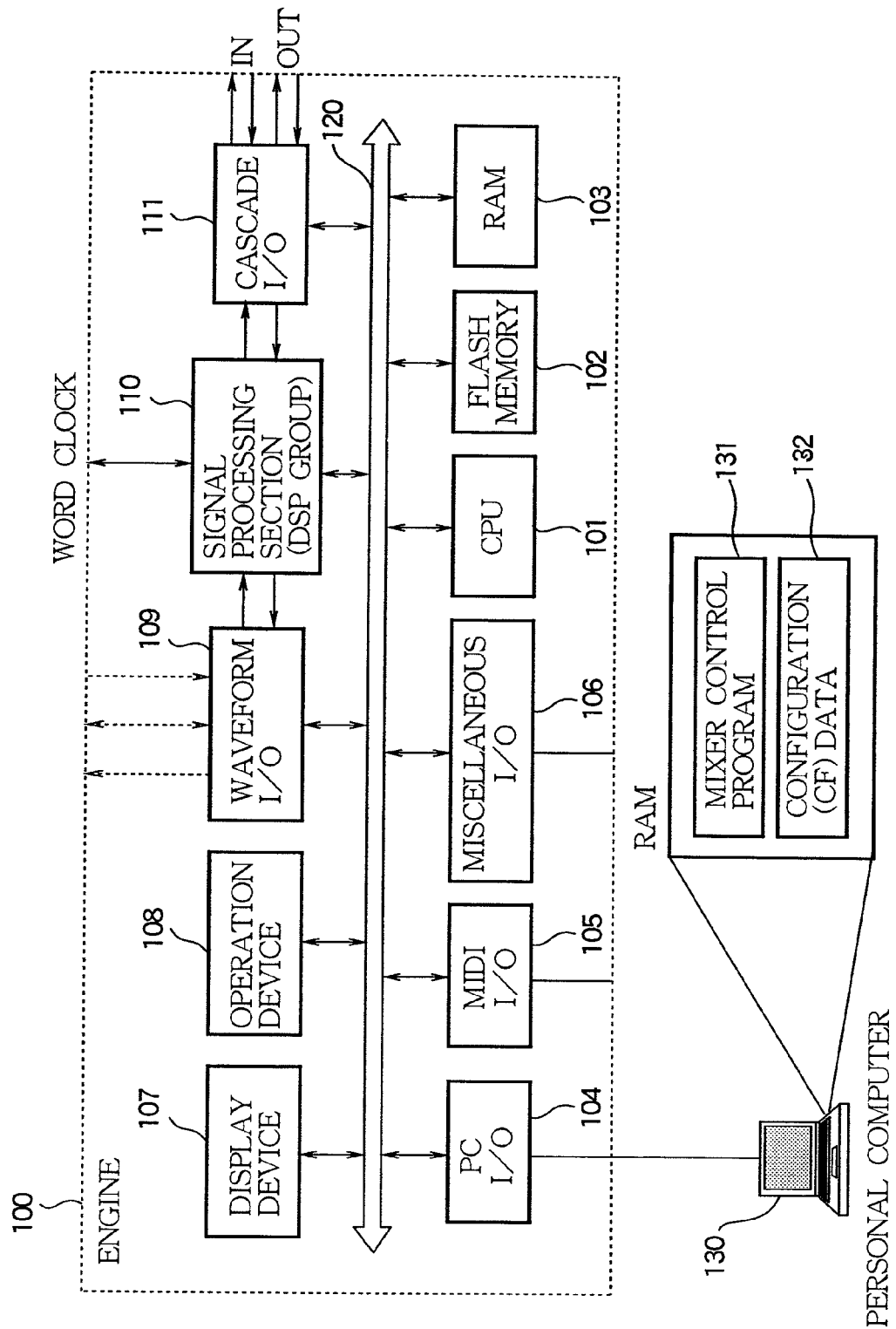
FIG. 1 is a configuration diagram of an engine in a digital mixer according to an embodiment of the present invention.

FIG. 1 shows the configuration of an engine for a digital mixer as an embodiment of the present invention. An engine 100 comprises a central processing unit (CPU) 101, flash memory 102, RAM (random access memory) 103, a PC input/output interface (I/O) 104, a MIDI I/O 105, a miscellaneous I/O 106, a display device 107, an operation device 108, a waveform I/O 109, a signal processing section (DSP group) 110, a cascade I/O 111, and a system bus 120.

The central processing unit (CPU) 101 controls entire mixer operation. The flash memory 102 is nonvolatile memory that stores various programs and data used for the CPU 101 and the DSP in a signal processing section 110. The RAM 103 is nonvolatile memory used as a load area and a work area for a program executed by the CPU 101. The PC I/O 104 represents interfaces (e.g., LAN, USB, and serial I/O) for connection with an external personal computer (hereafter acronymed PC) 130. The MIDI I/O 105 is an interface to connect various MIDI devices with each other. The miscellaneous I/O 106 is an interface to connect the other devices. The display device 107 is used to display various information provided on a mixer's external panel. The operation device 108 represents various operation devices that are provided on the external panel and can be operated by users. The waveform I/O 109 is an interface for interchanging sound signals with external devices and provides the following functions. For example, an A/D (analog/digital) conversion function receives an analog sound signal, converts it into a digital signal, and passes it to the signal processing section 110. A digital signal input function receives a digital sound signal and passes it to the signal processing section 110. A D/A (digital/analog) conversion function converts a digital sound signal output from the signal processing section 110 into an analog sound signal and outputs it to a sound system. The signal processing section 110 comprises several DSPs (digital signal processors). The DSPs execute various microprograms based on instructions from the CPU 101 to perform a mixing process, an effect provision process, and a volume level control process for waveform signals that are input via the waveform I/O 109. The signal processing section 110 outputs processed waveform signals via the waveform I/O 109. The cascade I/O 111 is an interface for making cascade connection to the other digital mixers. Making cascade connection can increase the number of input/output channels and the DSP throughput.

The engine 100 of the digital mixer permits customization of a mixer configuration implemented by the signal processing section 110. The mixer configuration can be created and edited on the screen of the PC 130 through the use of a specified mixer control program 131 (application software instructions) running on the PC 130. The created mixer configuration is referred to as configuration (actually CF data on the PC). A mixer control program 131 generates the configuration as configuration (CF) data 132 on the memory in accordance with user's operations on the screen. The CF data 132 can be saved as a file on any writable storage from the PC 130. When the CF data resides in the memory or the storage on the PC 130, the CF data (after compiled (to be described)) can be transferred to the engine 100. The engine can store the CF data transferred from the PC 130 in the flash memory 102 for saving. A specified operation is performed to read the CF data stored in the flash memory 102 into current memory (to be described) on the RAM 103 or directly expand the CF data transferred from the PC 130 into the current memory. The engine 100 operates based on the CF data in the current memory to implement the mixer according to the mixer configuration defined by the CF data.

Not only an end user, but also an agency can be a user who creates and edits the CF data on the PC 130. When a mixer is installed in a hall, for example, an agency goes to the hall and connects the PC 130 to the mixer. The agency can create and edit the CF data for the mixer configuration suited for the hall and store the CF data in the flash memory 102. In this case, the mixer may be non-programmable (i.e., End users are not allowed to create or edit the mixer configuration. They can only call to use the mixer configuration created by the agency). An end user can use the operation device 108 on the panel to read the CF data stored in the flash memory 102. The user can operate the mixer according to the mixer configuration defined in the CF data. Accordingly, the user need not connect the PC 130 to the mixer during operations. Obviously, it is possible to connect the PC 130 to the mixer and control the mixer by operating the PC 130 (execution mode to be described).

Figure 2:
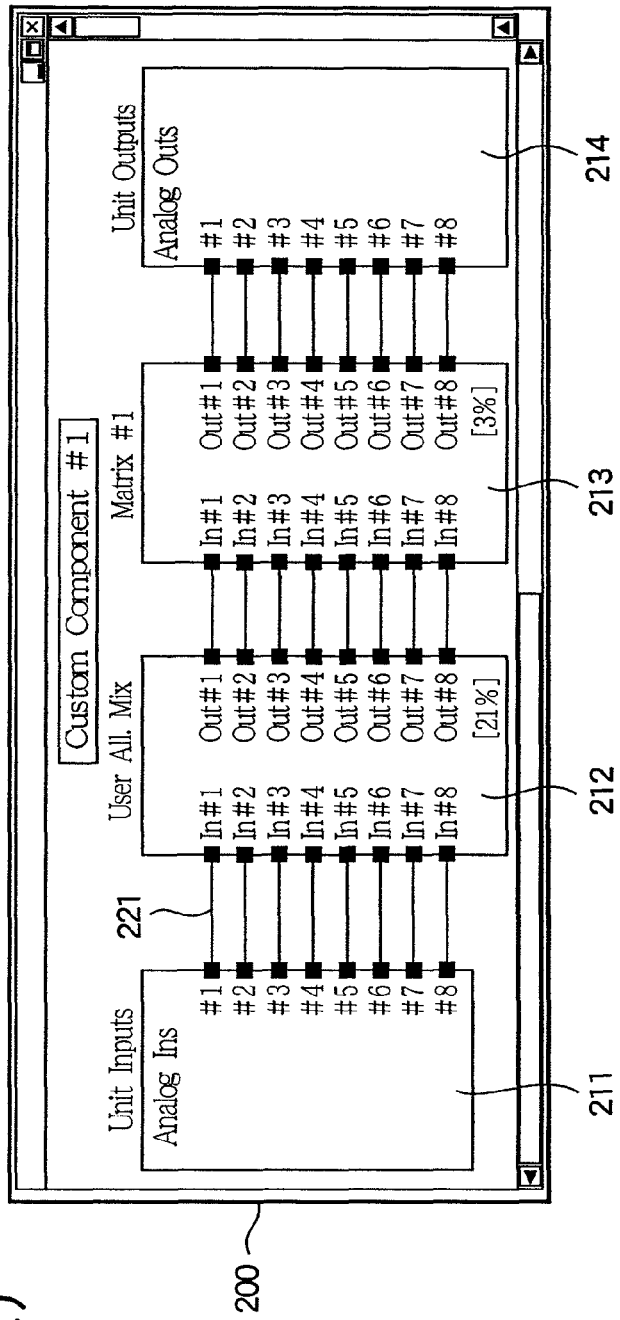
FIGS. 2(a) and 2(b) are diagrams showing examples of a configuration screen and a parameter setup screen.
Figure 2:
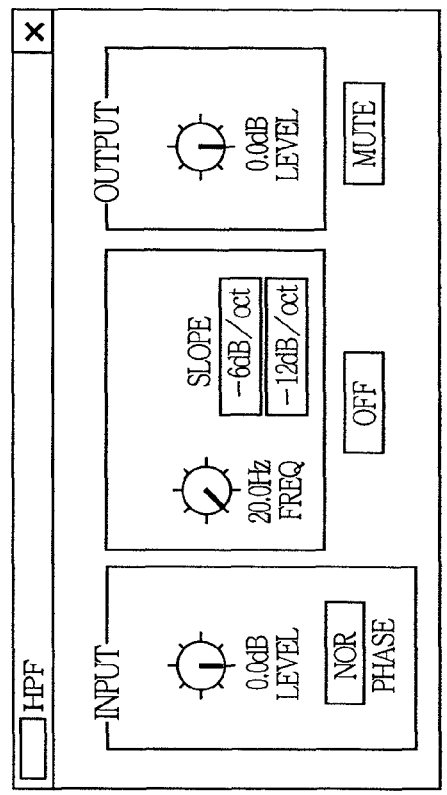

FIG. 2(*a*) shows a screen (called a configuration screen) example 200 for creating and editing the CF data 132 on the PC 130 based on the mixer control program 131. The reference numeral 211 denotes an input component; 212 denotes a C component User All Mix; 213 denotes P component Matrix#1; and 214 denotes an output component. The P component is a basic unit part block constituting the configuration. For example, the P component provides components such as audio processors including a mixer, a compressor, an effect, and a crossover and respective parts including a fader, a switch, a pan, and a meter. The C (custom) component is created and edited by a user and comprises a plurality of P components or C components. According to specified operations, the user can select any components from the selectable P components or C components and arrange them on the screen as shown in FIG. 2(*a*). According to specified operations, the user can also draw a connection line (e.g., 221) between component terminals. Drawing a connection line is equivalent to defining signal input/output relationship between the components. The completed CF data 132 can be saved on a hard disk, for example. After the CF data is compiled (converting the CF data into information interpretable for the engine 100), it can be transferred to the engine 100 from the PC 130 via the PC I/O 104. It may be preferable to allow the engine 100 to read the CF data from removable storage media such as memory cards.

The mixer control program 131 has two operation modes, i.e., edit mode and execution mode. A specified operation can switch between the edit mode and the execution mode. The edit mode is used to create or edit CF data. The execution mode is used to realtime control the engine 100 from the mixer control program 131 for the PC 130. For example, let us assume that the configuration screen displays a mixer configuration that contains a component having a fader. When the user uses a mouse to operate the fader, the execution mode realtime reflects that operation on the engine 100. The execution mode makes it impossible to change the component configuration and connection lines. The execution mode is selectable only when the configuration (displayed on the configuration screen) called to the current memory for the PC 130 matches the configuration called to the current memory for the engine 100.

FIG. 2(*b*) shows an example of a parameter setup screen for P components. In the configuration screen in FIG. 2(*a*), double-clicking on any P component displays the parameter setup screen for the P component. The parameter setup screen makes it possible to configure values (not only numerics but also on/off-states) for various parameter items in the P component. FIG. 2(*b*) shows an example of the parameter setup screen showing P components for a HPF (high-pass filter). Different P component types accompany different parameter items configurable for the components. The parameter setup screens are available for respective P component types. When a parameter value is changed for the P component on the parameter setup screen, that change is realtime reflected on the engine 100 in the execution mode. The edit mode enables offline editing (not reflecting a change on the engine 100, but changing only data in the PC 130). A presently configured value for each parameter is referred to as a current value. When a new P component is selected and is arranged in the configuration screen, a default value is taken as a current value for the component.

Figure 3:
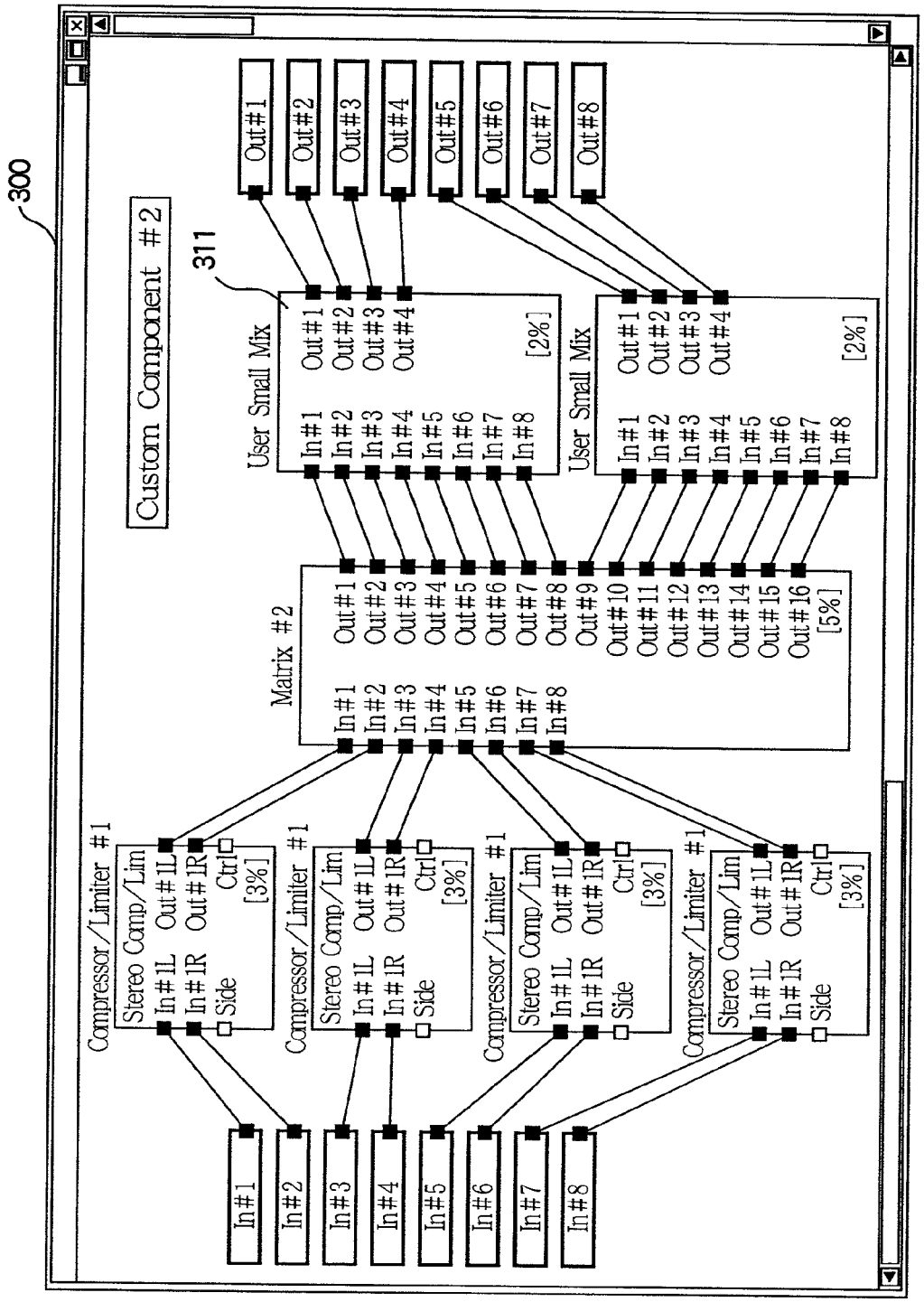
FIG. 3 is a diagram exemplifying a C component creation and edit screen.

Double-clicking on any C component in the configuration screen of FIG. 2(*a*) opens a creation and edit screen for that C component. FIG. 3 shows a C component creation and edit screen example 300 displayed when a C component 212 in FIG. 2(*a*) is double-clicked. A user can create and edit C components in the screen 300 like creating and editing the mixer configuration in FIG. 2(*a*). The created and edited C component can be assigned any name and can be saved as a C component (actually CC data on the PC, to be described later). The saved C component can be recalled and reused on the configuration screen in FIG. 2(*a*) or the C component creation and edit screen in FIG. 3. The other C components than itself can be used as C component constituent elements. In FIG. 3, the reference numeral 311 denotes an example of another C component used as a C component constituent element. Though the subsequent drawings are omitted, double-clicking on the C component 311 displays the creation and edit screen for the C component and allows any customization for it.

Figure 4:
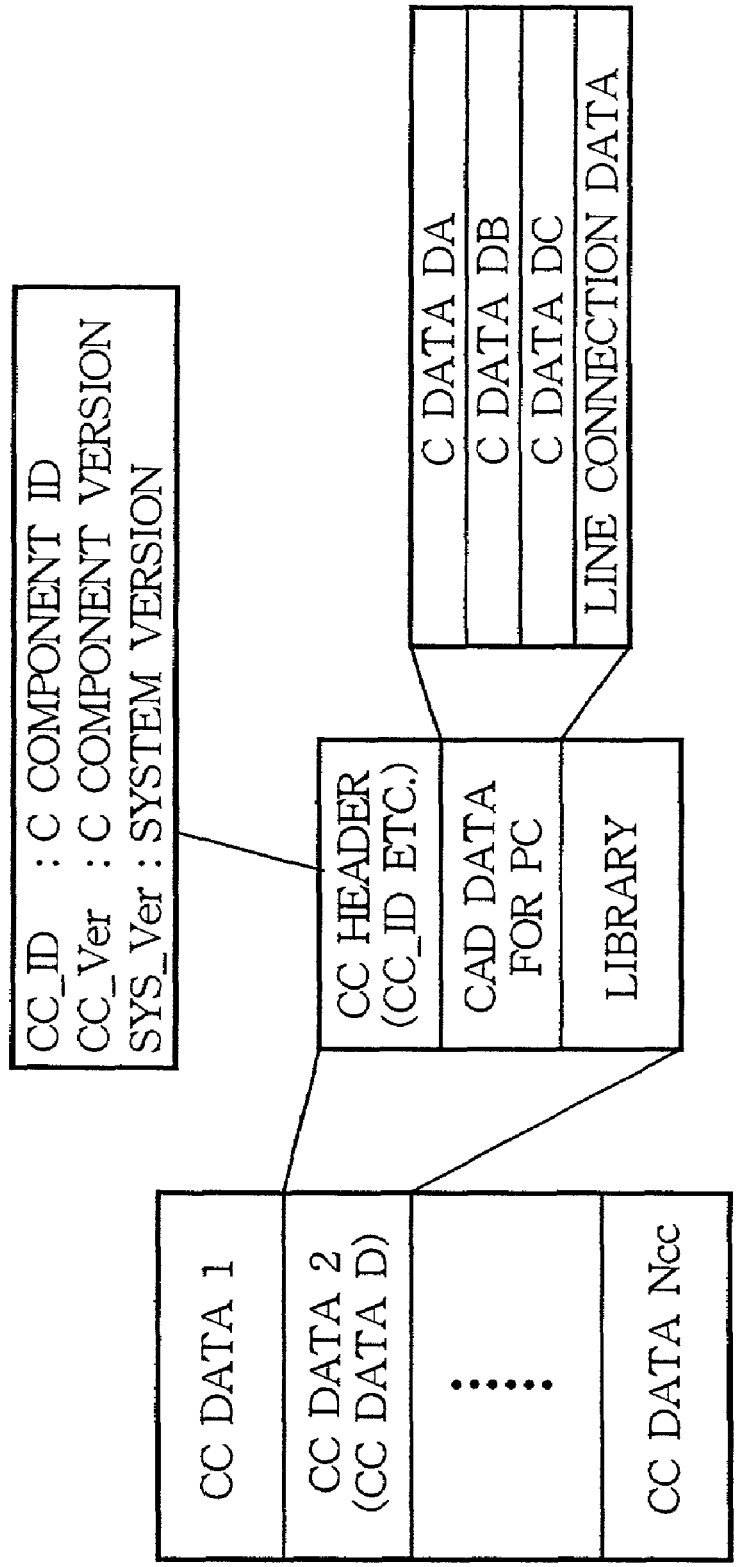
FIGS. 4(a), 4(b) and 4(c) are configuration diagrams of various data (part one of two) provided on the PC.
Figure 4:
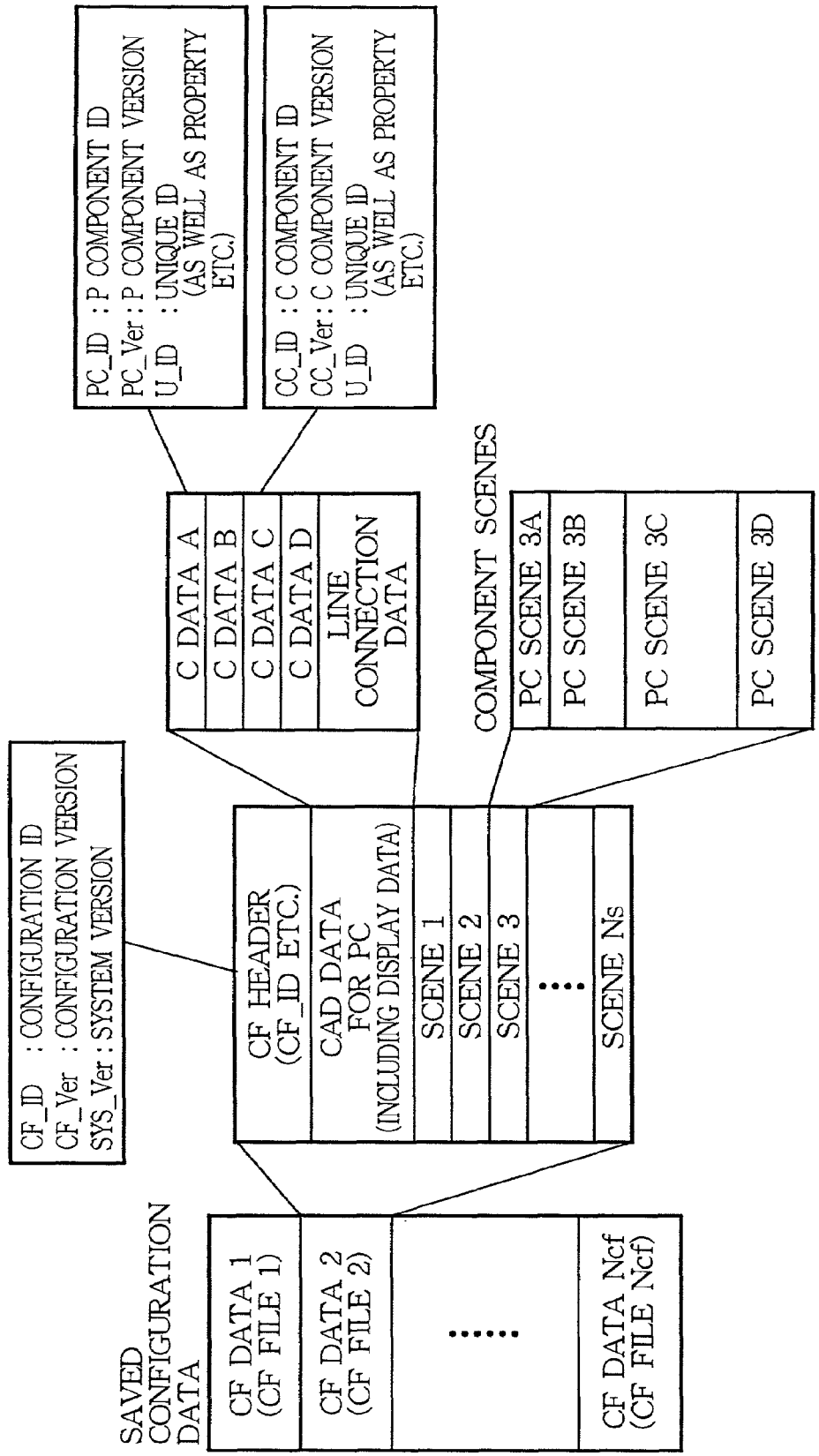

FIG. 4(*a*) shows the configuration of P component data (PC data) used by the mixer control program 131 for the PC 130. The PC data is equivalent to definition data that specifies P components and is previously stored in any storage section accessible from the mixer control program 131. The PC data is provided for each type of P components. In this example, it is assumed that there are Npc types. One piece of PC data comprises a PC header, PC configuration information, a PC processing routine, a display and edit process routine, and a library. The PC header comprises a P component ID (PC_ID), a P component version (PC_Ver), and the like. The use of PC_ID and PC_Ver can specify the PC data.

The PC configuration information indicates of which elements the P component is composed. The PC configuration information contains display data such as a parameter setup screen for the P components. The element is equivalent to a part (e.g., a constituent element of the parameter setup screen) constituting the P component. Specifically, the PC configuration information contains the order of elements (including the presence or absence of elements) and information indicating whether a parameter of the element corresponds to any one of data types such as a single value, a one-dimensional array, and a two-dimensional array. When the element has the data type of one-dimensional array or two-dimensional array, the number of its elements is not included. When the P components are used as constituent elements of the CF data, the number of elements is determined by the PC data's property. The PC processing routine is a program to perform various processes concerning the PC configuration information. When processing CF data, the mixer control program 131 uses the PC processing routine for each component. The display and edit process routine is a group of programs used to create and edit CF data. The library will be described later.

FIG. 4(b) shows the configuration of C component data (CC data) used by the mixer control program 131 for the PC 130. The CC data is definition data that specifies a C component. One piece of CC data comprises a CC header, CAD data for PC, and a library. The CC header comprises a C component ID (CC_ID), a C component version (CC_Ver), and a system version (SYS Ver). The use of CC_ID and CC_Ver can specify the CC data.

The CAD data for PC defines which components configure the C component using which connection lines. The CAD data for PC comprises C data to specify a P component or a C component to be used as a constituent element for the C component and connection line data connecting between the components. The C component can use another C component than itself as a constituent element of the C component. Accordingly, the CAD data for PC in the CC data can contain C data that specifies another CC data. In the CAD data for PC in CC data 22 of FIG. 4(b), for example, C data DA and C data DB are assumed to be C data to specify PC data DA and PC data DB, respectively. However, C data DC is assumed to be C data to specify CC data DC. The configuration of the CAD data for PC is the same as the CAD data for PC of CF data to be described in FIG. 4(c). The further description is omitted. Especially, the later description about the CF data will cover which data constitute the C data.

Figure 5:
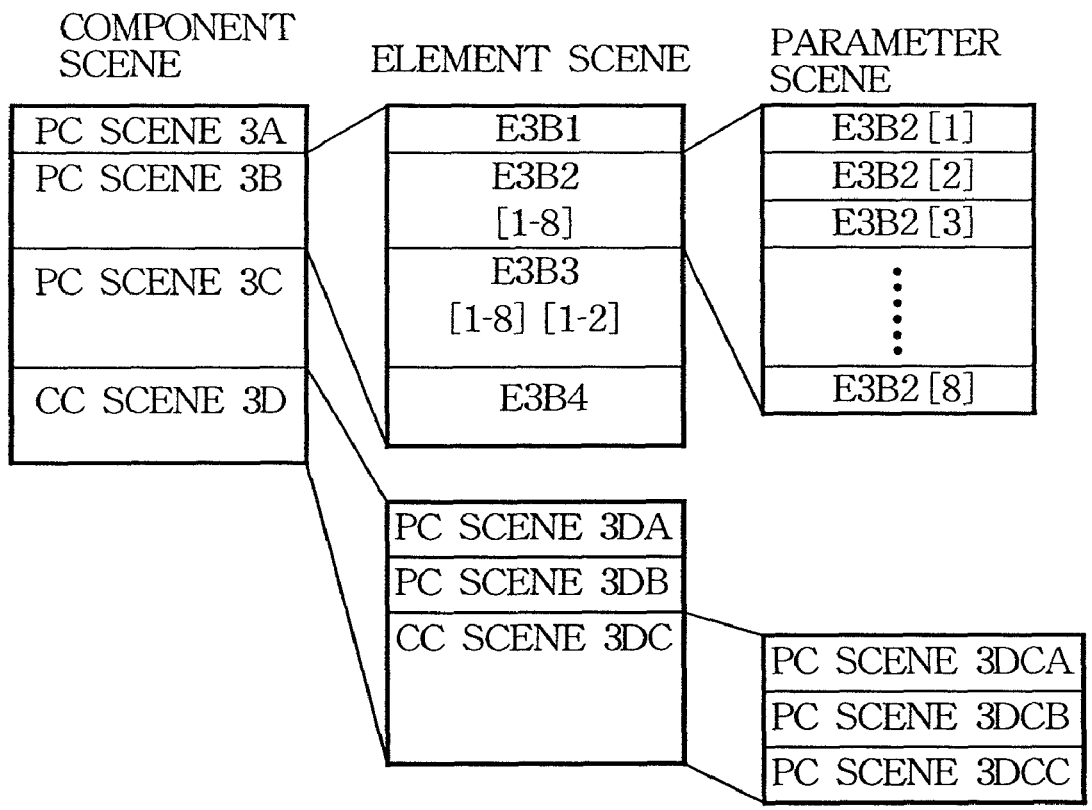
FIGS. 5(a), 5(b) and 5(c) are configuration diagrams of various data (part two of two) provided on the PC.
Figure 5:
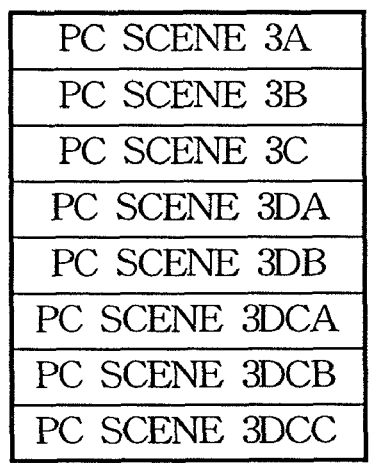

A user granted a specified authentication can freely create and edit the C component data on the screen as shown in FIG. 3. Accordingly, respective CC data in FIG. 4(b) can be stored as files in a specified storage. When the C component creation and edit screen is displayed to create or edit data, the CC data to be created or edited is expanded in the current memory. The C component has the same data configuration in the current memory as that of the CF data in the current memory to be described in FIG. 4(c) or FIG. 5(c). The CC header and the CAD data for PC are expanded in the current memory for editing. Accordingly, the CAD data for PC in the CC data contains display data to display the C component creation and edit screen. The current memory for the C component is provided with an area to store current component scene data that is a current parameter value of the CC data to be created or edited. The configuration of the current component scene data is the same as a CC scene to be described in FIG. 5(a). The CC scene corresponding to the CC data to be created or edited is expanded as a PC scene.

FIG. 4(c) shows the configuration of CF data created and saved by the mixer control program 131 in the PC 130. CF data 1 through Ncf represent CF data that each specify one mixer configuration. Each CF data can be stored as a file in any storage (e.g., a hard disk in the PC). While the example shows CF file 1, CF file 2, and so on in order, each file is an independent unit of copy or movement in the file system on the PC 130. The term "CF file" is assumed to denote CF data stored in the hard disk and the like. The term "CF file" itself is assumed to denote data defining one mixer configuration comprising data having the diagramed content irrespectively of in which form the data is stored.

As shown in FIG. 4(c), one CF data comprises a CF header, CAD data for PC, and Ns pieces of scene data. The CF header comprises configuration ID (CF_ID), configuration version (CF_Ver), and system version (SYS Ver). The CAD data for PC defines which components configure the mixer configuration of the CF data using which connection lines. The CAD data for PC contains display data to display the configuration screen as shown in FIG. 2(a). The CAD data for PC comprises C data to specify a P component or a C component to be used as a constituent element for the configuration and connection line data connecting between the components.

The C data comprises an ID and a version to specify a P component or a C component, a unique ID (U_ID), and the other data (e.g., property). When a P component is specified, the ID and the version represent P component ID (PC_ID) and P component version (PC_Ver). When a C component is specified, the ID and the version represent C component ID (CC_ID) and C component version (CC_Ver). These IDs are configured to be able to distinguish between PC_ID and CC_ID (e.g., to divide the ID into a range to be used as PC_ID and a range to be used as CC_ID). The following description assumes that, in the CAD data for PC of the CF data in FIG. 4(c), three pieces of C data A through C specify PC data A through C, respectively; and C data D specifies CC data D. Accordingly, the mixer configuration for the CF data comprises three P components, one C component, and the connection line data. The above-mentioned C data configuration is the same as for the C data of the CAD data in the CC data as described in FIG. 4(b). The C component configuration for CC data in FIG. 4(b) comprises two P components, one C component, and the connection line data.

The following describes the scene data in the CF data of FIG. 4(c). Each one of scenes 1, 2, . . . , and Ns in FIG. 4(c) is scene data. A scene is a set of parameters for all components constituting one configuration. A parameter value is specified on the parameter setup screen as described in FIG. 2(b). The data configuration is determined based on the PC data in FIG. 4(a) specified by each C data's ID (PC_ID or CC_ID) and version (PC_Ver or CC_Ver) of the CAD data for PC; or the CC data in FIG. 4(b) and the property in the C data. The scene data defines one scene, namely, a data set of specific parameter values used to operate the components of the configuration. The PC 130 contains scene data to be edited on various screens such as the parameter setup screen currently residing in the current memory (of the PC 130). Such scene data is referred to as a current scene. Likewise, the engine 100 contains scene data that currently resides in the current memory (of the engine 100) and is used for processes in the signal processing section 100. Such scene data is also referred to as a current scene. Even though the same mixer configuration is used, there may be a need to change parameters in the mixer configuration depending on situations. To satisfy this, one piece of CF data can contain scene data for a plurality of scenes. Each scene is specified with scene number n that is called scene n. FIG. 4 shows scenes 1, 2, . . . , and Ns, where 1, 2, . . . and Ns represented by n are scene numbers. When an instruction is issued to store (save) scene n, the current scene is saved in a scene data storage area for the specified scene n. When an instruction is issued to recall (invoke) scene n, the scene data is read from the scene data storage area for scene n and is called (written) to the current scene.

The scene data comprises a row of component scenes indicating parameter values for the components. (A component scene corresponding to the P component is called a PC scene. A component scene corresponding to the C component is called a CC scene.) The order of the rows corresponds to the rows of C data in the CAD data for PC. In FIG. 4, PC scene 3A denotes a parameter of PC data A as a P component specified by C data A. PC scene 3B denotes a parameter of PC data B as a P component specified by C data B, and so on. CC scene 3D denotes a parameter of CC data D as a C component specified by C data D. The current scene and the scene data for each scene stored in the current memory have the above-mentioned data configurations specified by the CAD data for PC.

FIG. 5(a) shows in detail the configuration of the scene data in FIG. 4(c). Component scenes in FIG. 5(a) correspond to those in FIG. 4(c). One PC scene comprises a row of parameters (element scenes) to be specified for elements constituting one corresponding P component. a row of element scenes corresponds to a row of elements indicated by the PC configuration information (FIG. 4(a)) for the P component. For example, element scene E3B1 in FIG. 5(a) indicates a parameter for the first element constituting the P component for PC scene 3B. In this example, since the component for the PC scene 3B comprises four elements, there are four elements, too. Each element scene adopts any of data types such as a single value, a one-dimensional array, and a two-dimensional array. For example, the element scenes E3B1 and E3B4 each comprise a single parameter value. E3B2 comprises a one-dimensional array composed of eight elements. E3B3 is an element scene having the data type of two-dimensional array.

One element scene comprises several parameter values (parameter scenes) corresponding to its data type. The same type of P components always accompanies the same element configuration (including the order) for the P components. Accordingly, it also causes the same order of rows of element scenes in the PC scene corresponding to the P components. However, even the same type of P components is subject to a change in the number of elements in the one-dimensional or two-dimensional array of the element scene corresponding to specified parameters. The data length of the element scene may change. When the element scene is a one-dimensional or two-dimensional array, the number of elements is stored in the property (FIG. 4(c)) for the C data to specify the component including that element.

One CC scene comprises a row of component scenes for the components constituting the corresponding C component. The row corresponds to the row of components indicated by the CAD data for PC (FIG. 4(b)) of the C component. For example, the CC scene 3D in FIG. 5(a) is the component scene data for the CC data 2 in FIG. 4(b) corresponding to the C component specified by the C data D in FIG. 4(c). The CC data 2 comprises a row of PC data DA specified by C data DA, PC data DB specified by C data DB, and CC data DC specified by C data DC (FIG. 4(b)). The CC scene 3D correspondingly comprises PC scene 3DA, PC scene 3DB, and CC scene 3DC. Likewise, the CC scene 3DC comprises a row of component scenes corresponding to the component data defined in the CAD data for PC of the corresponding CC data.

As a result, a row of component scenes (i.e., one piece of scene data) as shown in FIG. 5(a) is actually equivalent to a row of individual PC scenes as shown in FIG. 5(b). In short, the following processes determine the order of rows. (1) The process acquires the order of sequences of P components and C components from the sequence of C data in the CAD data for PC corresponding to the highest CF data. (2) With respect to a portion of C components out of them, the process references the CAD data for PC corresponding to the CC data specified by the C data and likewise acquires the order of sequences of P components and C components. (3) When C components are further found therein, the process (2) is repeated.

The PC data or the CC data is specified by the ID (PC_ID or CC_ID) and the version (PC_Ver or CC_Ver) for each C data in the CAD data associated with the CC data specifying the corresponding C component. The above-mentioned data structure of the CC scene is determined based on the PC data or the CC data and the property in the C data. When the C component is nested, the same technique is used to determine the data structure of the nested low-order CC scenes.

FIG. 5(c) shows the configuration of CF data in the RAM when the CF data is to be processed by the mixer control program 131 for the PC 130. The current memory provided in the RAM of the PC 130 has: an area to store the entire CF data (i.e., the CF header, the CAD data for PC, and a plurality of pieces of scene data); an area to store a current scene as scene data being currently configured; and a buffer to form CAD data for engine. The configuration screen as shown in FIG. 2(a) appears based on the CAD data for PC in the current memory. The result of editing on the configuration screen is reflected on the CAD data for PC in the current memory. The current scene represents current parameter values (current values) for the components in the displayed configuration. When the parameter setup screen is used to edit component parameters, the result of editing is reflected on the current scene. The current scene configuration is the same as that described in FIGS. 5(a) and 5(b) and is expanded to a row of the lowest-order PC scenes. The mixer control program 131 recognizes the hierarchical structure as indicated by the reference numerals 401 through 403. When the CF data is compiled, the buffer to form CAD data for engine generates CAD data for engine from the CAD data for PC. The CC data created or edited on the screen in FIG. 3 has a similar configuration in the RAM. In this case, the configuration substitutes the CC header for CF header and eliminates scenes 1, 2, and so on, and the buffer to form CAD data for engine.

The following describes libraries. A library previously stores several patterns of parameter settings for each component. In FIG. 4(a), for example, the PC data 2 contains a library that stores setup data 1, 2, and so on. The P component can be called to the configuration screen (FIG. 2(a)) and the C component creation and edit screen (FIG. 3) and can be used as a constituent element. In this case, it is possible to read any setup data in the library for the PC data of the P component and define the setup data as a parameter at a time.

One piece of setup data in the library is a data set of the parameter value for the component. This is the same as the component scene. The configuration is the same as that of the component scene as described in FIG. 5(a). The component scene already determines the number of elements including one-dimensional or two-dimensional element scenes (by describing the number of elements in the property for the C data of the CAD data for PC in FIG. 4(c)). The component scene only comprises the parameter values themselves. Each setup data in the library contains data for the number of elements as mentioned above in addition to the parameter values. The PC configuration information for the PC data in FIG. 4(a) does not contain the number of elements. The number of elements is determined when the PC data is called as a constituent element on the configuration screen (FIG. 2(a)) or the C component creation and edit screen (FIG. 3). (For example, an initial value may be set to the number of elements specified in setup data 1.)

The C component can have a similar library. It should be noted that respective setup data in the C component library comprise a row of setup data for PC data or CC data as constituent elements of the C component. When CC data is nested, a nested portion is expanded to setup data of individual P components. For example, each setup data in the library for CC data 2 in FIG. 4(b) comprises a parameter set corresponding to PC data DA specified by C data DA, a parameter set corresponding to PC data DB specified by C data DB, and a parameter set corresponding to CC data DC specified by C data DC. The parameter set portion corresponding to CC data DC is expanded to a parameter set for each constituent element constituting the corresponding C component. As a result, each setup data in the C component library becomes a row of parameter sets (including the parameter values and data for the number of elements) corresponding to individual P components. The data configuration of respective setup data in the C component library is determined by the same method as the method of determining the data configuration of the corresponding C component scene. That is, the following processes are used to determine the order of rows of setup data for each component. (1) The process obtains the order of rows of P components and C components from a row of C data for the CAD data in the corresponding CC data. (2) With respect to the C component portion, the process references the CAD data for the CC data specified by the C data and likewise obtains the order of rows of P components and C components. (3) When the C component is further contained therein, the process (2) is repeated. Moreover, as shown in FIG. 5(a), for example, the data configuration inside the setup data for each component causes different numbers of elements in the one-dimensional or two-dimensional array for the element scene. The same component may have different setup data configurations. In order to determine the data configuration inside the setup data for each component, the reference is made to the property of the C data to specify the corresponding component.

As mentioned above, the mixer control program 131 running on the PC 130 can be used to enable operations on the screen as shown in FIG. 2(a). The component data in FIGS. 4(a) and 4(b) can be used to create and edit the CF data in the current memory as shown in FIG. 5(c). The CF data can be saved as a CF file according to the configuration as shown in FIG. 4(c). According to the screen operations as shown in FIG. 3, the component data in FIGS. 4(a) and 4(b) can be used to create and edit CC data having the configuration in FIG. 4(b) in the current memory that is used for C component creation and editing and has the configuration similar to that in FIG. 5(c). The CC data can be saved as a file.

On the screens in FIG. 2(a) and FIG. 3, double-clicking on a displayed P component can display the parameter setup screen as shown in FIG. 2(b) and allow respective parameters to be set. For P components and C components, it is possible to read setup data from the library to set parameters at a time (writing parameters to the current scene and writing PC data and CC data in the CAD data for PC to the property). Some operations may be available. One example is to select one P or C component on the screen in FIG. 2(a) or FIG. 3 and read one piece of setup data from the component library according to specified operations. Another example is to once display the parameter setup screen as shown in FIG. 2(b), read one piece of setup data from the library on this screen, and set parameters at a time. It is possible to set parameters at a time by reading setup data from the library. This is called "loading" of setup data from the library. By contrast, it is also possible to save the parameter settings in the current memory as setup data in the library. This is called "saving" of setup data in the library.

As mentioned above, the CF file saved at the PC 130 can be compiled and then be transferred to the engine 100 to be stored in the flash memory 102. On the engine 100, a user operates the operation device on the panel by viewing the screen displayed on the display device 107. In this manner, the user can specify the CF file stored in the flash memory 102 and load it into the current memory of the RAM 103. The engine 100 operates as a mixer having the mixer configuration defined by the CF data in the current memory.

FIG. 6(a) partially shows the CF data stored in the flash memory 102 inside the engine 100. The CF data stored in the flash memory 102 has almost the same configuration of the CF data in the PC as shown in FIG. 4(c). FIG. 6(a) shows only differences. That is, the CAD data for PC in FIG. 4(c) is replaced by the CAD data for engine in FIG. 6(a) in the engine 100. The CAD data for engine equals the CAD data for PC as long as the former represents the mixer configuration as represented with the configuration screen. The CAD data for engine is represented in binary by excluding display data. One reason is that the engine requires no data for display positions and the like for components and connection lines on the screen in FIG. 2(a). The other reason is to decrease the amount of data. Further, the engine has no concept about the C component. Accordingly, the CAD data for engine is expanded to C data that individually specifies the lowest-layer PC data. In other words, the CAD data for engine does not contain C data for specifying CC data. Such C data is expanded up to the C data that specifies the PC data. This expansion is performed by the compilation. When CF data 2 in FIG. 4(c) is compiled, for example, compiling CF data 2 in FIG. 4(c) references CC data 2 in FIG. 4(b) specified by C data D in the CAD data for PC. That C data D is expanded to C data DA, C data DB, and C data DC. Further, C data DC specifies CC data that is also expanded likewise. In this manner, the CAD data for PC in the CF data is all replaced by the C data that specifies the PC data. After the compilation, each C data in the CAD data for engine becomes data that specifies the P component data stored in the flash memory 102 of the engine 100. The above-mentioned process is performed during the compilation to generate CAD data for engine in the buffer to generate CAD data for engine as shown in FIG. 5(c). The PC 130 stores the CF file according to the format in FIG. 4(c) in any storage. After the compilation, the CF file can be saved according to the format in FIG. 6(a) on any storage. The CF file having the format in FIG. 6(a) is transferred to the engine 100 from the PC 130 and then is stored in the flash memory 102. The flash memory 102 is provided with a specified file system (that may or may not be compliant with the PC file system). The CF data is stored in the form of a plurality of CF files.

FIG. 6(b) shows the configuration of the CF data for the engine 100 in the RAM 103. The current memory in the RAM 103 is provided with: an area to store a CF header and CAD data for engine of the CF data; an area to store a current scene as currently set scene data; and a microprogram formation buffer. There is provided a microprogram to realize the mixer configuration for the CAD data. When CAD data for engine is read in the current memory, that microprogram is automatically expanded in the microprogram formation buffer. The microprogram is transferred to the signal processing section 110. In this manner, the DSP group in the signal processing section 110 realizes operations for the mixer configuration. Reading from the flash memory is faster than reading from the PC storage (such as the hard disk). The scene recall speed does not decrease even though a plurality of scene data is not read in the current memory. The CAD data for engine is also not necessarily read into the current memory. Data in the flash memory may be used directly.

The current scene signifies a current value of a parameter for each component of the mixer configuration CAD data for engine expanded in the current memory. When the current scene is read into the current memory, or when the current scene is modified, the current scene is automatically transferred to the signal processing section 110. The signal processing section 110 expands the transferred current scene into coefficient memory for the DSP group. The DSP group of the signal processing section 110 uses coefficients of the coefficient memory to execute the transferred microprogram. In this manner, the signal processing section 110 realizes operations under the mixer configuration for CAD data in the current memory and through the use of parameter values for the current scene. The current scene configuration for the engine is similar to that described with reference to FIGS. 4 and 5.

FIG. 6(c) partially shows the configuration of P component data previously stored in the flash memory 102. The P component data has almost the same configuration of the P component data in the PC as shown in FIG. 5(c). FIG. 6(c) shows only differences. That is, the display and edit process routine and the library in FIG. 5(c) are replaced by the PC microprogram in FIG. 6(c) in the engine 100. The engine 100 cannot display the components in the configuration screen as shown in FIGS. 2(a) and 2(b) and the parameter setup screen containing a plurality of operation devices. Consequently, it is needless to use a display and edit routine to display and edit them. No library is available because the engine does not use any library. Instead, the engine 100 needs a PC microprogram compliant with the components in FIG. 6(c). This is because the engine 100 needs to send a microprogram (generated in the microprogram generation buffer) compliant with the mixer configuration of the CAD data for engine to the DSP group. Though not shown, the PC processing routines are assumed to be various programs that process the configuration information in the engine. The number of inputs/outputs for the components varies with parameter settings. The PC microprogram in the component data is assumed to store all variations of the number of these inputs/outputs. Since the engine has no concept of the C component, the flash memory 102 does not store the C component data as shown in FIG. 4(b).

The system according to the embodiment is characterized in that, when the mixer control program 131 uses C components, it is possible to interchangeably use component scenes and library's setup data between different C components. Specifically, component scenes can be interchanged between different CC data. Likewise, the library's setup data can be interchanged between different CC data. In terms of the way of interchanging CC scenes, there are two locations that contain CC scenes corresponding to the C components according to FIGS. 4 and 5, i.e., (a) a plurality of pieces of scene data in a plurality of CF files stored in the storage section for the PC 130 and (b) the current scene and a plurality of pieces of scene data in the current memory of the PC 130. As a principle, CC scenes are interchanged between any two components (including the same ones) in the locations (a) and (b). When unchanged, the CF files stored in the storage of the PC 130 require a long time to interchange data. Before interchanging data, the CF files for data interchange are read as CF data into copy memory in the RAM of the PC 130. The CF data in the RAM is used to interchange data. After completion of the data interchange, the CF data is written back to the original storage or the flash memory. According to the embodiment, this process is represented as interchanging data for CF files. When the mixer control program is operating on one PC, there may be a case of moving CC scenes of CF data under control of another PC to that PC. The above-mentioned feature of the embodiment is effective for any situations including such case of interchanging CC scenes. A similar method is used to interchange setup data of the C component library. Setup data for the C component library is available in the C component data in FIG. 4(b). The setup data can be read into the current memory to set C component parameters. On the contrary, the parameter setting in the current memory can be written to the setup data for the C component library. In this case, such setup data can be interchanged between different C components under a given condition.

The following shows typical examples of interchanging the above-mentioned CC scenes.

(1) The PC 130 is used to specify one CC scene of one piece of scene data in one CF file and to specify one CC scene of the current scene. The CC scene in the specified CF file is read into the CC scene of the specified current scene. This process is to recall the CC scene. (2) The PC 130 is used to specify one CC scene of the current scene and to specify one CC scene of one piece of scene data in one CF file. The CC scene in the specified current scene is written to the CC scene in the specified CF file. This process is to store the CC scene. (3) Another process is to specify one CC scene of one scene for one CF file or CF data as a read origin and to specify one CC scene of one scene for one CF file or CF data as a write destination. The CC scene is copied from a storage area for the CC scene specified as the read origin and to a storage area for the CC scene specified as the write destination.

The following describes typical examples of interchanging setup data for the above-mentioned C component library. (1) The PC 130 is used to specify one piece of setup data for a library in one piece of CC data in FIG. 4(b) and to specify one C component in the current memory. The setup data for the specified library is read as the setting of the C component for the specified current memory. This process is to load setup data for the library. (2) The PC 130 is used to specify one C component in the current memory and to specify one piece of setup data for a library in one piece of CC data in FIG. 4(b). The setting of the C component in the specified current memory is written to setup data for the library in the specified CC data. This process is to save setup data for the library. (3) Another process is to specify one piece of setup data for a library in one piece of CC data as a read origin and to specify one piece of setup data for a library in one piece of CC data as a write destination. The setup data is copied from a storage area of the setup data for the library specified as the read origin to a storage area of the setup data for the library specified as the write destination.

The terms "recall", "restore", and "copy" generally denote interchange of data without modifying data contents. According to the embodiment, however, recalling, storing, and copying a CC scene generally modifies the contents of the associated scene data. The reason follows. Scene data is incidental on the C component. When the configuration of a C component corresponding to the CC scene as a read origin differs from the configuration of a C component corresponding to the CC scene as a write destination, the configuration of the CC scene also differs. The same applies to the terms "load" and "save" for setup data in libraries.

As mentioned above, the embodiment allows setup data for component scenes and libraries to be interchanged between different C components. This is because each C component is provided with a CC_ID. The present invention provides each C component with the CC_ID that indicates the data compatibility. The CC_ID checks the data compatibility between CC scenes. The same CC_ID means that the data compatibility is ensured between the component scenes. The CC_ID is also attached to CC data corresponding to a library in the C component. The CC_ID can be used to check the compatibility for interchanging setup data in the library.

The data compatibility needs to be ensured for CC scenes between C components with the same CC_ID. Further, the data compatibility needs to be ensured for setup data in a library between C components with the same CC_ID. For these purposes, embodiment provides a U_ID (unique ID) for a constituent element of the C component. The following describes this topic.

The CC_ID specifies CC (custom component) data (irrespectively of whether it is available as a file or in the current memory). CC_Ver shows a version that is initially set to 1.00, for example, and is incremented each time CC data is edited. Let us consider that any CC data is opened in the current memory, edited, and then saved (saved with a different file name or overwritten). In this case, the CC data is provided with a CC header that has the same CC_ID and an incremented CC_Ver. When new CC data is created in the PC 130, the newly created CC data is provided with a new CC_ID and an initial CC_Ver. The PC 130 manages the most recent CC_ID value to be provided next. The CC_ID contains, for example, a device ID of the PC that created the CC data, thus preventing an accidentally matching CC_ID from being provided. Separate ranges are provided for CC_IDs so as to avoid a match between CC_IDs attached to CC data created and edited by an agency and by users. The above-mentioned method is used to provide CC_IDs and CC-Vers within the range of CC data under the management of the agency or each end user. When IDs and versions are provided as mentioned above, there may be different CC data having the same CC_ID. Retroactively following the editing process resulting in the CC data should reach the CC data having the same CC_ID and the initial CC_Ver value. The CC data having the same CC_ID is defined to belong to the same "series".

PC_ID (P component ID) identifies each PC data described in FIG. 4(*a*). PC_Ver (P component version) indicates a version of the PC data. Each C data for the CAD data in the CC data uses PC_ID and PC_Ver to specify a P component and uses CC_ID and CC_Ver to specify a C component.

U_ID (unique ID) is used for sequentially editing of the CC data configuration and specifies a P or C component as a constituent element of the CC data in the series. When new CC data is created on the C component creation and edit screen, for example, P or C components are read on the screen and are connected to each other through connection lines. At this time, a new U_ID value is attached to C data each time the C data is newly added to the CAD data so as to specify the added component. When the C data is deleted, the U_ID for that C data becomes missing. That value is not used as the U_ID in the series for the CC data. When there is a missing U_ID value, a new U_ID value is assigned to C data that is newly added thereafter. Let us consider a case where CC data is edited, C data is added or deleted, and the CC data is saved at any step in the middle of the editing. Even in this case, it is possible to assume C data having the same UD value to be the same C data. It should be noted that the "same C data" does not mean "completely the same data". Even though U_ID values match, two pieces of C data exist in different CC data. When parameters are edited in the respective CC data, the data may be different. However, it is ensured that the C data have the same type and the corresponding component scenes have the same structure (except the number of array elements in an element scene).

Figure 7:
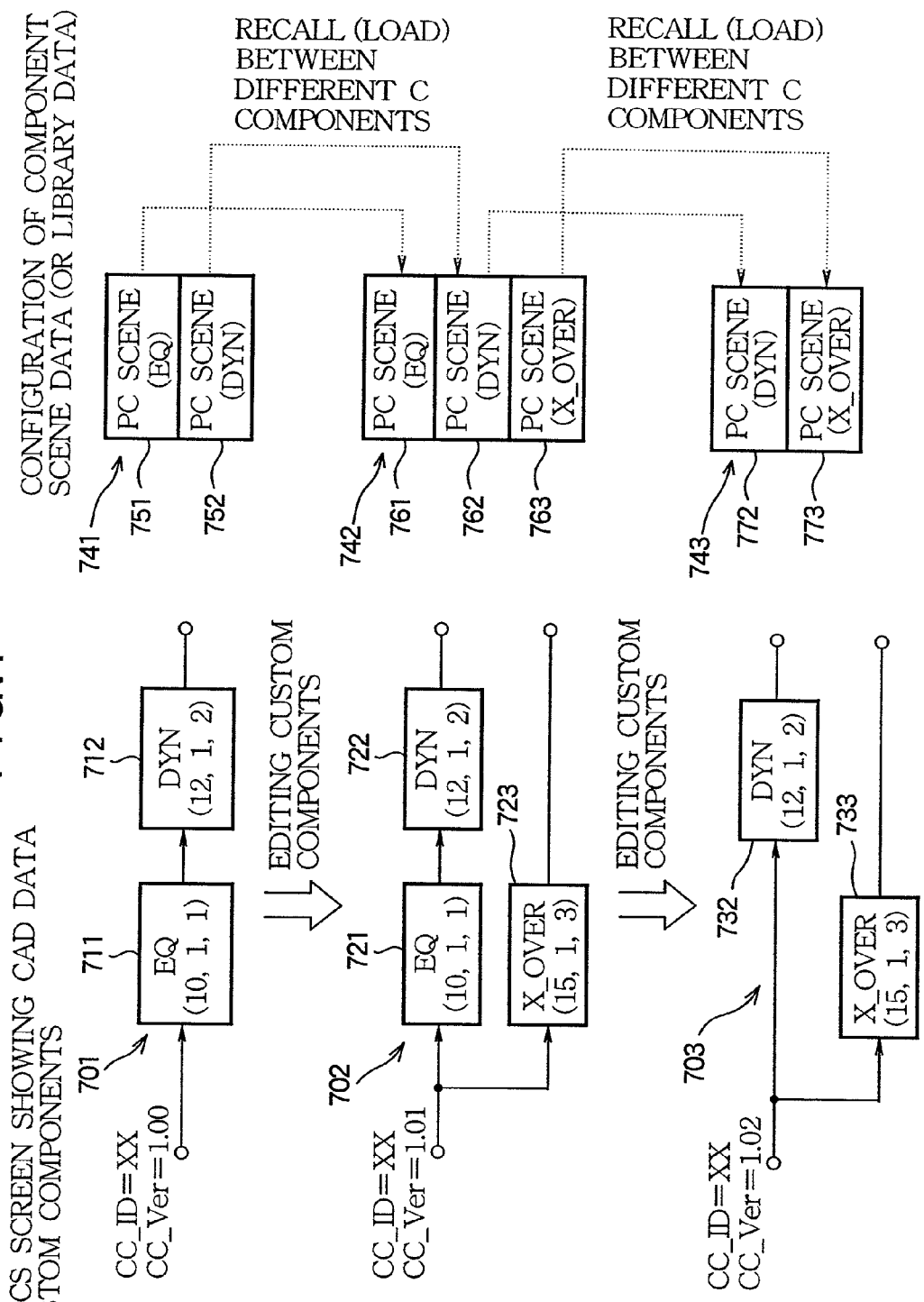
FIG. 7 is a diagram exemplifying methods of providing IDs and versions during CC data editing and configurations of scene data and setup data.

FIG. 7 shows an example of assigning an ID and a version during CC data editing and the configuration of the CC scene data. The reference numeral 701 denotes CAD data for PC of a new C component first created on the C component creation and edit screen as shown in FIG. 3. Since the CAD data is newly created, it is provided with a new CC_ID=XX and CC_Ver=1.00 (initial value). The CAD data comprises two P components, i.e., equalizer EQ 711 and dynamics DYN 712. A block represents each P component and contains three numerics in parentheses. The numerics denote PC_ID, PC_Ver, and U_ID, respectively from the beginning. The EQ 711 has U_ID set to 1. The DYN 712 has U_ID set to 2.

The reference numeral 702 denotes a modification of the CC data 701 by addition of a new P component, i.e., crossover X_OVER 723 connected to the CC data 701 through a connection line. The CC data 702 is then saved with a different name. When CC data 702 is saved, it is provided with the same CC_ID=XX as the CC data 701. The version is incremented to CC_Ver=1.01. The added X_OVER 723 has U_ID=3. This is because the U_ID is used up to 2 in this series. The reference numeral 703 denotes a modification of the CC data 702 from which the EQ 721 is deleted. The CC data 703 is then saved with a different name. When CC data 703 is saved, it is provided with the same CC_ID=XX as the CC data 701 and 702. The version is incremented to CC_Ver=1.02. If a component is added in the state of the CC data 703, the U_ID is set to 4. This is because the U_ID is used up to 3 in this series. The deleted U_ID=1 becomes missing and will not be used for editing of CC data in this series afterwards.

The reference numeral 741 denotes one CC scene (assumed to be already saved as a CC scene included in the scene data of given CF data) created for a C component of the CC data 701. Corresponding to the two P components in the CC data 701, there are arranged a PC scene 751 corresponding to the EQ 711 and a PC scene 752 corresponding to the DYN 712.

The reference numeral 742 denotes a CC scene corresponding to the CC data 702. When the CC scene 742 is edited, recalling the CC scene 741 in the CC data 701 copies the PC scene 751 and 752 in the CC scene 741 to the PC scenes 761 and 762 in the CC scene 742, respectively. This recall is made between the CC data 701 and 702 and is assumed to be a recall between different C components. Generally, a recall between different C components uses a different C component configuration. Based on the difference, the CC scene structure also differs. Accordingly, even when the PC scene 751 is read, for example, it is generally unknown at which location of the CC scene 742 the PC scene should be written. However, the mixer system according to the embodiment provides the same CC_ID even when the CAD data is edited and is saved with a different name. When the CC data exists in the same series, the U_IDs can be used to make correspondence between components for the constituent element. Therefore, an action is made to confirm a match between CC_IDs of the CC data for the recall origin and destination. For example, it is then found that the U_ID is set to 1 for the EQ 711 as a P component corresponding to the PC scene 751 read from the CC scene 741. It is found from the CC data 702 that the P component having the U_ID set to 1 is the EQ 721. It is found that the PC scene corresponding to the EQ 721 is stored at 761. The PC scene 751 is copied to the location 761. When the CC scene 741 is recalled to the CC scene 742, the PC scene 763 in the CC scene 742 has no PC scene corresponding to the recall origin and is therefore left unchanged.

The above-mentioned process also takes effect when the CC scene 742 for the CC data 702 is recalled during editing of the CC scene 743 for the CC data 703. The PC scenes 762 and 763 in the CC scene 742 are copied to the PC scenes 772 and 773 in the CC scene 743. A recall process sequence attempts to copy the PC scene 761 in the CC scene 742. However, the P component corresponding to the PC scene has the U_ID set to 1. The CC data as the recall destination does not contain a component whose U_ID set to 1. Consequently, the PC scene 761 is not copied. In this manner, the recall between different C components is realized.

FIG. 7 shows the example where the C component uses all P components as constituent elements. The same concept applies when the C component uses the other C components as constituent elements (e.g., nesting C components). When the EQ 711 is replaced by a C component, for example, a CC scene may be used for the corresponding scene data. The U_ID is provided to the C component (specifically to C data specifying the C component) for management. This makes it possible to confirm that the C component is identical in the series. The same concept can be applied to CC scenes as the C components.

While FIG. 7 shows the example of interchanging CC scenes, the same applies to an interchange of setup data in the library. The above-mentioned cases (1) through (3) represent typical examples of interchanging setup data in a C component library. Any of the cases allows setup data in the library to be interchanged when a match is confirmed between CC_IDs of different C components. When the reference numeral 741 denotes one piece of setup data in the library of the CC data 701, for example, the PC scenes 751 and 752 are interpreted as setup data corresponding to the P components 711 and 712, respectively. Let us assume the reference numeral 742 to be a C component's current scene for the CC data 702 in the current memory. In this case, the setup data 741 for the C component library can be loaded as a current component scene of the current C component 702. This is because it is possible to find correspondence between the current component scenes and the setup data 751 and 752 for the P components in a manner similar to recalling the component scene data as mentioned above. The same concept takes effect when the reference numeral 742 is interpreted as one piece of setup data in the C component library for the CC data 702.

FIG. 8 shows an example of writing an element scene. When CC_IDs match between different C components, the mixer system according to the embodiment can make correspondence between PC scenes and CC scenes using U-IDs of the C components as described with reference to FIG. 7. The P or C components with the same U_ID are provided with the same PC_ID or CC_ID and maintain the compatibility of parameters between them. However, there may be a case where the two components use different PC_Ver or CC_Ver versions or different property information indicating the component scale such as the number of terminals. For example, let us consider that the PC scene 751 for the CC data 701 in FIG. 7 is copied to the PC scene 761 for the CC data 702. The two PC scenes 751 and 761 match with respect to the structure, i.e., the order of rows of element scenes and the form (a single value, a one-dimensional array, or a two-dimensional array). Some element scenes may exist in only one of the two PC scenes. The number of array elements may differ. The presence or absence of elements in the PC scene is controlled by the PC configuration information about each P component. The number of elements in the PC scene is controlled by the property information about the corresponding C data for the CAD data. When the number of elements is changed, it is necessary to determine a rule to write parameter scenes.

FIG. 8(a) shows that an element scene comprise a single value. The reference numeral 801 denotes data Ex to be written; and 802 denotes data Eo as write destination. Writing the element scene rewrites the write destination data to Ex as indicated by the reference numeral 803.

FIG. 8(b) shows that an element scene uses the data form of one-dimensional array. The reference numeral 811 denotes data for an element scene to be written. The data comprises four elements. An element scene 812 is write destination and comprises six elements. As indicated by the reference numeral 813, a write process is performed to rewrite first through fourth elements in the write destination element scene to data E[1]x through E[4]x to be written. The original E[5]o and E[6]o remain unchanged. When an element scene 814 as write destination comprises two elements, the two elements are rewritten as indicated by the reference numeral 815. The elements E[3]x and E[4]x are ignored.

FIG. 8(c) shows that an element scene uses the data form of two-dimensional array. Element scene data 821 to be written comprises four row elements and three column elements. An element scene 822 as write destination comprises six row elements and two column elements. As indicated by the reference numeral 823, a write process is performed to rewrite only an overlapping portion. The other portion is ignored.

When an element scene is arrayed as mentioned above, the write process rewrites elements whose suffixes match between the write origin and the write destination. The write process ignores elements whose suffixes exist only in the write origin. The write process does nothing to elements whose suffixes exist only in the write destination.

The following summarizes basics of the process to interchange (recall, store, or copy) CC scenes corresponding to C components. (1) The process obtains CC data corresponding to a CC scene as the calling origin and obtains the row order of C data in the CAD data for the CC data. The row order becomes equivalent to that of component scenes constituting the CC scene as the calling origin. (2) Each component scene may comprise P components. In such case, the data structure of the component scene is determined by referencing: the PC configuration information about PC data for the P component; and the property of C data specifying the P component corresponding to the component scene. (3) When CC data is nested, it is similarly processed to determine the data structure of the corresponding CC scene.

Figure 10:
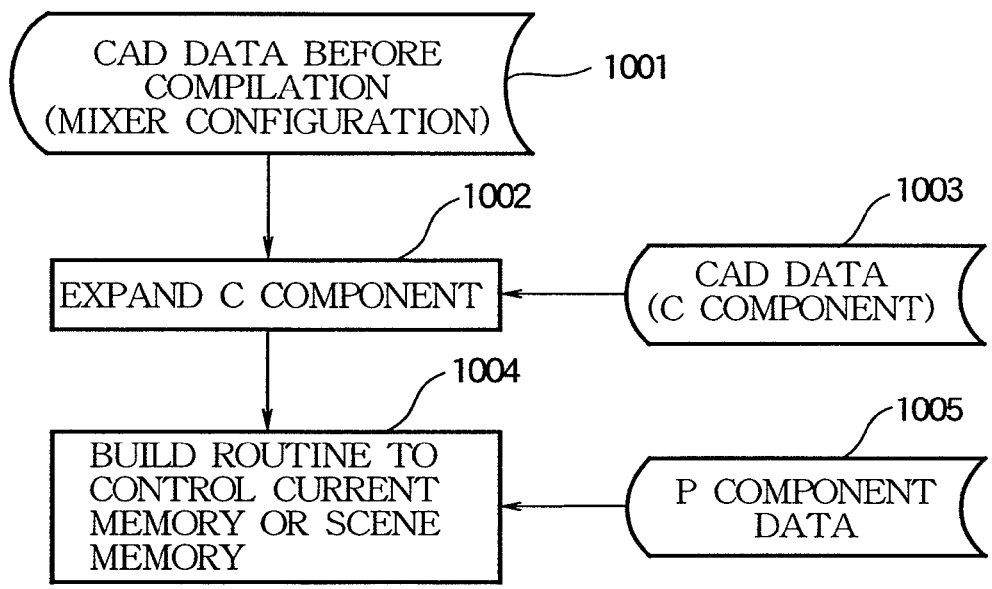
FIGS. 10(a) and 10(b) are flowcharts showing a preparation process.
Figure 10:
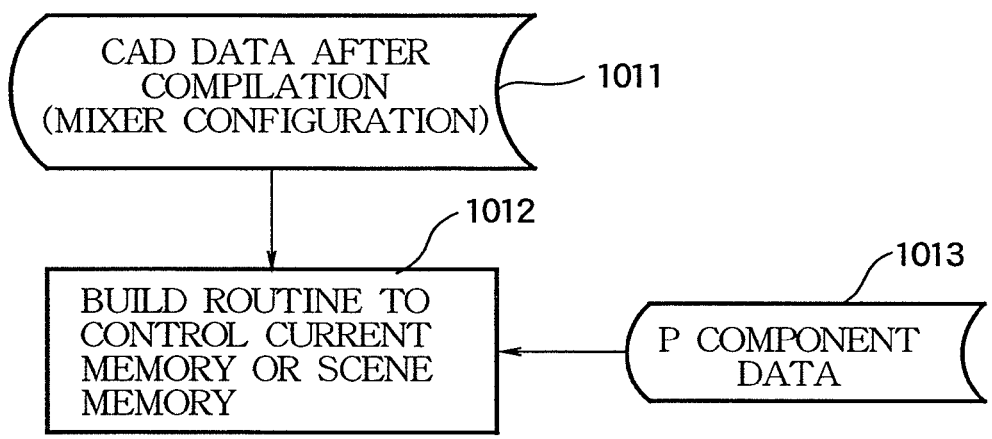

The above-mentioned process can obtain the data structure of the CC scene as the read origin. Likewise, the process obtains the data structure of the CC scene as the read destination. After that, the process confirms a match between CC_IDs as shown in FIGS. 7 and 8. The process confirms components with the matching U_IDs and interchanges component scenes between the corresponding components. The basics of the above-mentioned process are the same as for an interchange of setup data in a C component library. During (or prior to) the above-mentioned process, the mixer control program according to the embodiment builds a current access routine, a scene access routine, and a library access routine to implement the basics of the above-mentioned process. Those routines will be described in detail with reference to FIGS. 10 through 12.

Figure 9:
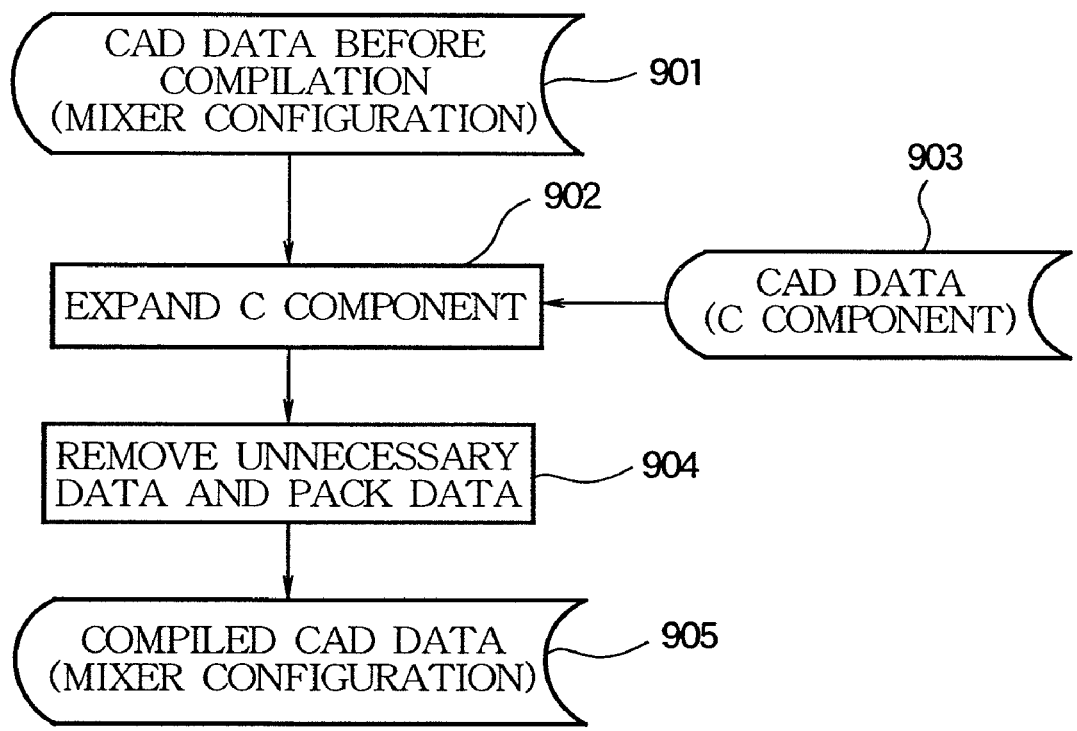
FIGS. 9(a) and 9(b) are flowcharts showing a compilation process.
Figure 9:
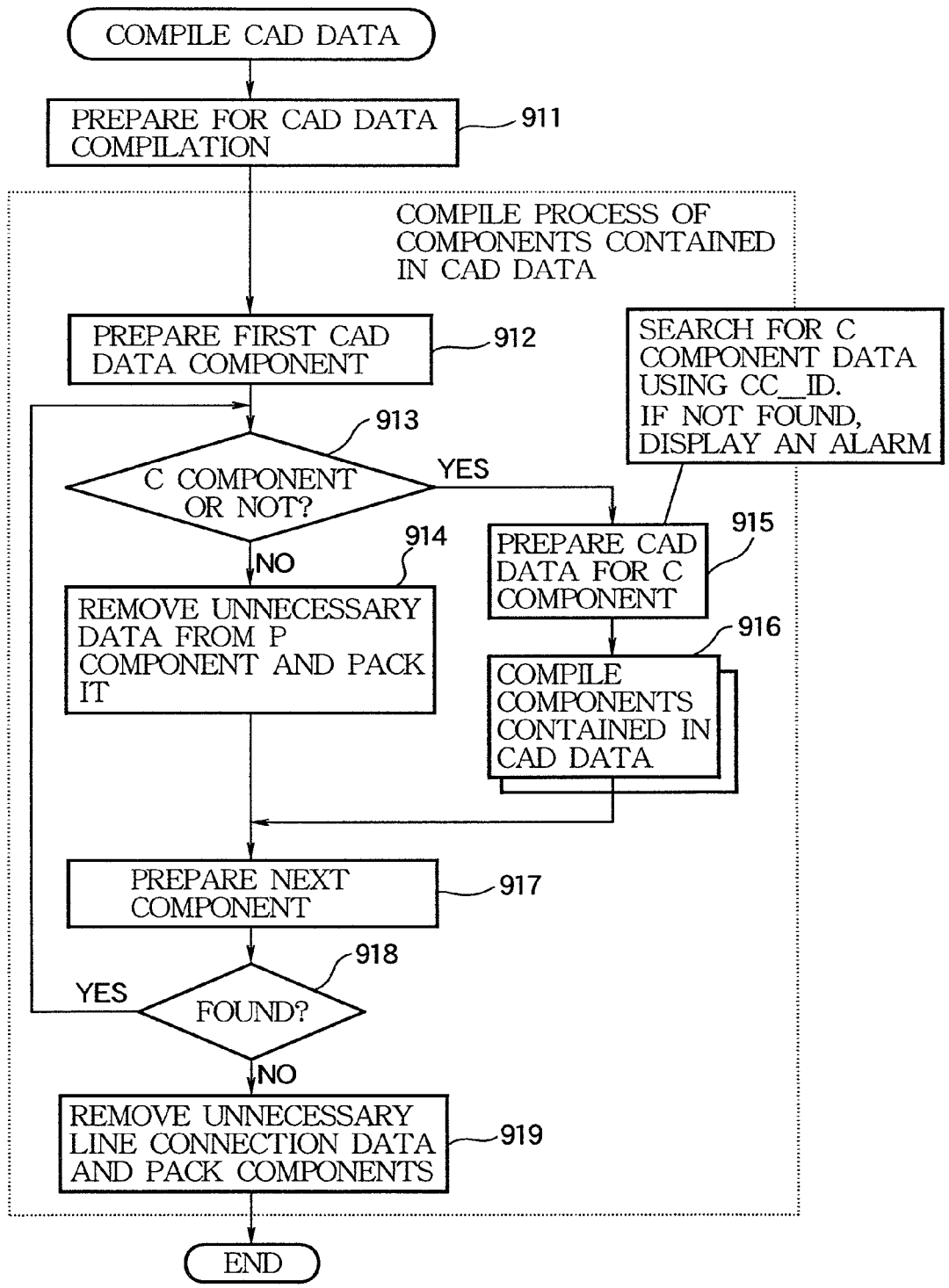

FIG. 9(a) shows an outline of a compilation process. The reference numeral 901 denotes CAD data before compilation. This data is equivalent to the CAD data for PC in the CF data in the current memory. The compilation process inputs CAD data 901 at step 902. When the CAD data already contains CC data, the process references C component data 903 (FIG. 4(b)) and expands its CC data portion to the PC data. When CC data is nested, the process further expands the nested portion. At step 904, the process removes unnecessary data (e.g., display data) and packs the data so as to comply with a format transferable to the engine. The above-mentioned process generates compiled CAD data 905.

FIG. 9(b) shows the detail of the compilation process described in FIG. 9(a). At step 911, the process performs preparative operations such as reading CAD data to be compiled. The process compiles components contained in the CAD data. At step 912, the process prepares the first component of the CAD data. At step 913, the process determines whether or not the prepared component is a C component. When the prepared component is a P component, the process proceeds to step 914 to remove unnecessary data from the P component and pack it, and then proceeds to step 917. When the prepared component is a C component, the process prepares CAD data for the C component. This process is to search for C component data using the CC_ID to specify the C component. When the data is not found, the process displays an alarm. At step 916, the process compiles components contained in the CAD data read at step 915. This recursively performs the process in FIG. 9(b). At step 917, the process prepares the next component. When the next component is not found at step 918, the process proceeds to step 919. The process removes unnecessary connection line data, packs the data, and then terminates. When the next component is found, the process returns to step 913 from 918 to continue.

FIG. 10(a) shows a preparatory process in the mixer control program 131 to access scene data in the current scene memory or the scene memory (scene data may be saved as a file or may be read into a work area of the RAM). This process is performed, for example, when a selection is made to process the mixer configuration that contains C components as constituent elements. The reference numeral 1001 denotes CAD data before compilation of the selected mixer configuration (CF data). At step 1002, the process reads the CAD data 1001. When a C component is contained, the process references CAD data (FIG. 4(b)) 1003 for CC data and expands the C component. This means expanding the C component to its constituent elements, i.e., P components. When the C component is nested, the process repeats the expansion to finally obtain the configuration of the lowest-order P component. At step 1004, the process references PC data 1005 (FIG. 4(a)) to build the control routines such as the current access routine, the scene access routine, and the library access routine.

To determine the scene data's data structure, the process expands the mixer configuration corresponding to the scene data as mentioned above, and then references the configuration information about each PC data and the property information contained in the mixer configuration. The process builds the above-mentioned routines to provide the access function corresponding to the determined data structure. After building, the process can use these routines to access scene data attached to the mixer configuration to be processed. The scene data specifies the maximum unit of one scene (i.e., one piece of scene data contained in the CF data in FIG. 4(c)). The routine is built to access that unit of scene data. In addition, access functions are provided in units of component scenes, element scenes, and parameters at lower-order hierarchies. Especially, when processing a CC scene, the process identifies the data structure of the CC scene for the C component and builds an access routine compliant with the data structure. The use of the access routine can easily recall, store, and copy CC scenes.

FIG. 10(b) shows a preparatory process in the mixer engine for current scene memory or scene memory. The reference numeral 1011 shows CAD data after compilation of the mixer configuration to be processed. At step 1012, the process reads the CAD data 1011 and references P component data (FIG. 6(c)) 1013 to build control routines such as the current access routine and the scene access routine. Any C component need not be expanded because the engine has no concept about it.

FIG. 11 is a schematic diagram showing how to store or recall the scene memory. On the left side of FIG. 11, the mixer control program performs the process in FIG. 10(a) to build a current access routine 1111 and a scene access routine 1113. The current access routine 1111 provides a function to access scene data 1112 to be stored or recalled in the current memory. The scene access routine 1113 provides a function to access scene data 1114 to be stored or recalled in scene memory 1115. These routines 1111 and 1113 provide a function to access scene data having a data structure determined based on CF data's CAD data 1121, CC data's CAD data 1122, and PC data 1123. These access routines are used to allow scene data to be interchanged in accordance with instructions of issued store and recall commands. While the schematic diagram is shown in units of scene data, the same concept also takes effect when the scene data 1112 and 1114 are CC scenes. Observation of the above-mentioned process basics makes it possible to read and write data as described in FIGS. 7 and 8.

On the right side of FIG. 11, the engine performs the process in FIG. 10(b) to build a current access routine 1131 and a scene access routine 1133. The current access routine 1131 provides a function to access scene data 1132 to be stored or recalled in the current memory. The scene access routine 1133 provides a function to access scene data 1134 to be stored or recalled in scene memory 1135. These routines 1131 and 1133 provide a function to access scene data having a data structure determined based on CF data's CAD data 1141 and PC data 1143. These access routines are used to allow scene data to be interchanged in accordance with instructions of issued store and recall commands.

FIG. 12 is a schematic diagram showing how to save or load C component's setup data from the library. On the left side of FIG. 11, the mixer control program performs the process in FIG. 10(a) to build a current access routine 1211 similar to that described in FIG. 11 and a library access routine 1213. The library access routine 1213 provides a function to access setup data 1214 to be loaded or saved in a library 1216. The current access routine 1211 provides a function to access a CC scene 1212 in current memory 1215 having the data structure determined based on CF data's CAD data 1221, CC data's CAD data 1222, and PC data 1223. The library access routine 1213 provides a function to access setup data 1214 having the data structure determined based on CC data's CAD data 1222 and PC data 1223. These access routines are used to allow scene data to be interchanged in units of C components in accordance with instructions of issued load and save commands. Observation of the above-mentioned process basics makes it possible to read and write data as described in FIGS. 7 and 8.

On the right side of FIG. 12, the engine prepares a current access routine 1231 that provides a function to access current memory 1232. The current access routine 1231 provides a function to access PC scenes in the current memory having the data structure determined based on CF data's CAD data 1241 and PC data 1243. The engine has no concept about libraries. In execution mode, the mixer control program may load setup data for a C component. In this case, the engine is supplied with a load command for setup data corresponding to each of P components constituting the C component. The engine then loads setup data corresponding to each P component into the current memory. The reference numerals 1251, 1252, and 1253 denote setup data corresponding to the P components. The current access routine 1231 assigns the setup data to positions of corresponding PC scenes 1261, 1262, and 1263 in the current memory in units of P components.

What is claimed is:

1. A system comprising:
an apparatus for editing mixer configuration data describing a mixer configuration of sound signal processing; and
a digital mixer having a sound signal processing unit capable of executing a program corresponding to the mixer configuration, said mixer configuration composed of various components, as parts for the sound signal processing, including one or more preset components and one or more customer components,
wherein the apparatus is provided for creating and editing the custom component and comprises:
a mixer configuration data storage that stores the mixer configuration data indicating components and connections among the components in the mixer configuration;
a preset component data storage that stores preset component data defining preset components;
a custom component data storage that stores custom component data defining configurations of custom components each composed of preset components, the custom component data indicating the preset components and connections among the preset components in the configuration of each custom components;
a custom component creating section that creates a component configuration of a custom component by selecting components among the preset components and connecting among the selected components, and writes custom component data describing the created component configuration in said custom component data storage, the written custom component data indicating the selected components and the connections among the selected components;
a mixer configuration creating section that create a mixer configuration by selecting components among the preset components and custom components and connecting among the selected components, and writes mixer configuration data describing the created mixer configuration in said mixer configuration data storage, the written custom component data indicating the selected components and the connections among the selected components; and
a compiling section that compiles the mixer configuration data stored in said mixer configuration data storage to generate the compiled mixer configuration data interpretable and executable for the digital mixer; and
a transferring section that transfers the compiled mixer configuration data to the digital mixer, wherein the digital mixer comprises:
a present component data storage that stores preset component data; and
a program supplying section that forms a signal processing program based on the compiled mixer configuration received from the apparatus and the preset component data stored in the preset component data storage, and provides the signal processing program to said sound signal processing unit, and
wherein said compiling section of the apparatus comprises an expansion section that expands any custom component included in the mixer configuration described by the mixer configuration data by referencing the custom components data corresponding to the custom components, to obtain mixer configuration data describing a mixer configuration not comprising any custom component and composed of preset components only, the obtained mixer configuration data indicating the preset components and connection among the preset components, therefore the digital mixer being able to form said signal processing program without referencing the custom component data.

2. The apparatus according to claim 1, wherein the expansion section performs expansion of the custom component data when the digital mixer selects a mixer configuration which includes one or more of the custom component.

3. The apparatus according to claim 1, further comprising an access section that prepares an access routine to access scene data based on a configuration of the custom component, the scene data being a parameter set for use in operation of the custom component and having a data arrangement specified by the configuration of the custom component.

4. The apparatus according to claim 1, wherein the custom component creating section selects components from the preset components and existing custom components to create a new custom component, and wherein said expansion section performs a recursive expansion operation on a custom component to acquire mixer configuration data describing a mixer configuration composed of preset components only.

5. A non-transitory computer-readable storage medium storing instructions for use in an apparatus for editing mixer configuration data describing a mixer configuration of sound signal processing to be executed by a digital mixer having a sound signal processing unit capable of executing a program corresponding to the mixer configuration, said mixer configuration composed of various components, as parts for the sound signal processing, including one or more preset components and one or more customer components, the instructions when executed by the apparatus causing the apparatus to perform a method of creating and editing the custom component, wherein the method comprises the steps of:
storing, in a preset component data storage of the apparatus, preset component data defining preset components;
creating a component configuration of a custom component by selecting components among the preset components and connecting among the selected components, and writing custom component data describing the created component configuration in a custom component data storage of the apparatus, the written customer component data indicating the selected components and the connections among the selected components;
creating a mixer configuration by selecting components among the preset components and custom components and connecting among the selected components and writing mixer configuration data describing the created mixer configuration in a mixer configuration data storage of the apparatus, the written mixer configuration data indicating the selected components and the connections among the selected components;

compiling the mixer configuration data stored in said mixer configuration data storage to generate the compiled mixer configuration data interpretable and executable for the digital mixer; and transferring the compiled mixer configuration data to the digital mixer, wherein the digital mixer comprises;

a preset component data storage that stores present component data;

and a program supplying section that forms a signal processing program based on the compiled mixer configuration received from the apparatus and the preset component data stored in the preset component data storage, and provides the signal processing program to said sound signal processing unit, and wherein, at the step of compiling, the apparatus expands any custom component included in the mixer configuration described by the mixer configuration data by referencing the custom components data corresponding to the custom components, to obtain mixer configuration data describing a mixer configuration not comprising any custom component and composed of preset components only, thereby enabling the digital mixer to execute the mixer configuration described by the transferred compiled mixer configuration data without referencing the custom component data.

6. A method of editing mixer configuration data describing a mixer configuration of sound signal processing to be executed by a digital mixer having a sound signal processing unit capable of executing a program corresponding to the mixer configuration, said mixer configuration composed of various components, as parts for the sound signal processing, including one or more preset components and one or more customer components, the method comprising the steps of:

storing, in a preset component data storage of the apparatus, preset component data defining preset components;

creating a mixer configuration by selecting components among the preset components and custom components and connecting among the selected components, and writing custom component data describing the created component configuration in a custom component data storage of the apparatus, the written custom component data indicating the selected components and the connections among the selected components;

creating a mixer configuration by selecting components among the preset components and custom components and connecting among the selected components, and writing mixer configuration data describing the created mixer configuration in a mixer configuration data storage of the apparatus, the written mixer configuration data indicating the selected components and the connections among the selected components;

compiling the mixer configuration data stored in said mixer configuration data storage to generate the compiled mixer configuration data interpretable and executable for the digital mixer, and transferring the compiled mixer configuration data to the digital mixer, wherein the digital mixer comprises;

a preset component data storage that stores present component data; and a program supplying section that forms a signal processing program based on the compiled mixer configuration received from the apparatus and the preset component data stored in the preset component data storage, and provides the signal processing program to said sound signal processing unit, and wherein, at the step of compiling, the apparatus expands any custom component included in the mixer configuration described by the mixer configuration data by referencing the custom components data corresponding to the custom components, to obtain mixer configuration data describing a mixer configuration not comprising any custom component and composed of preset components only, thereby enabling the digital mixer to execute the mixer configuration described by the transferred compiled mixer configuration data without referencing the custom component data.

* * * * *